United States Patent
Yoshizumi et al.

(10) Patent No.: US 8,304,793 B2
(45) Date of Patent: Nov. 6, 2012

(54) III-NITRIDE SEMICONDUCTOR OPTICAL DEVICE AND EPITAXIAL SUBSTRATE

(75) Inventors: Yusuke Yoshizumi, Itami (JP); Yohei Enya, Itami (JP); Katsushi Akita, Itami (JP); Masaki Ueno, Itami (JP); Takashi Kyono, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 132 days.

(21) Appl. No.: 12/836,117

(22) Filed: Jul. 14, 2010

(65) Prior Publication Data
US 2011/0114916 A1   May 19, 2011

(30) Foreign Application Priority Data
Jul. 15, 2009   (JP) ................................. 2009-167177

(51) Int. Cl.
*H01L 33/00* (2010.01)

(52) U.S. Cl. ................ 257/95; 257/96; 257/97; 257/98; 257/102; 257/103; 257/E33.003; 257/E33.008; 257/E33.012; 257/E33.01; 257/E33.025

(58) Field of Classification Search .................... 257/95, 257/96, 97, 98, 102, 103, E33.003, E33.008, 257/E33.012, E33.01, E33.025
See application file for complete search history.

(56) References Cited

U.S. PATENT DOCUMENTS

| | | | |
|---|---|---|---|
| 2006/0098198 A1* | 5/2006 | Chism, II | 356/369 |
| 2010/0032644 A1* | 2/2010 | Akita et al. | 257/13 |
| 2010/0059759 A1 | 3/2010 | Akita et al. | |

(Continued)

FOREIGN PATENT DOCUMENTS

JP   2008-258503 A   10/2008

(Continued)

OTHER PUBLICATIONS

Hikosaka, T. et al. "Mg Doping in (1-101)GaN Grown on a 7° Off-Axis (0 0 1)Si Substrate by Selective MOVPE," Journal of Crystal Growth, 298, pp. 207-210 (2007).

(Continued)

*Primary Examiner* — Ngan Ngo
(74) *Attorney, Agent, or Firm* — Venable LLP; Michael A. Sartori

(57) ABSTRACT

A III-nitride semiconductor optical device has a support base comprised of a III-nitride semiconductor, an n-type gallium nitride based semiconductor layer, a p-type gallium nitride based semiconductor layer, and an active layer. The support base has a primary surface at an angle with respect to a reference plane perpendicular to a reference axis extending in a c-axis direction of the III-nitride semiconductor. The n-type gallium nitride based semiconductor layer is provided over the primary surface of the support base. The p-type gallium nitride based semiconductor layer is doped with magnesium and is provided over the primary surface of the support base. The active layer is provided between the n-type gallium nitride based semiconductor layer and the p-type gallium nitride based semiconductor layer over the primary surface of the support base. The angle is in the range of not less than 40° and not more than 140°. The primary surface demonstrates either one of semipolar nature and nonpolar nature. The p-type gallium nitride based semiconductor layer contains carbon as a p-type dopant. A carbon concentration of the p-type gallium nitride based semiconductor layer is not less than $2\times10^{16}$ cm$^{-3}$, and the carbon concentration of the p-type gallium nitride based semiconductor layer is not more than $1\times10^{19}$ cm$^{-3}$.

22 Claims, 13 Drawing Sheets

U.S. PATENT DOCUMENTS

2011/0223701 A1* 9/2011 Kyono et al. .................. 438/36

FOREIGN PATENT DOCUMENTS

| JP | 2009-021279 A | 1/2009 |
|----|---------------|--------|
| JP | 2009-021361 A | 1/2009 |

OTHER PUBLICATIONS

Hikosaka, T. et al. "Optical and Electrical Properties of (1-101)GaN Grown on a 7° Off-Axis (001)Si Substrate," Applied Physics Letters, vol. 84, No. 23, pp. 4717-4719 (2004).

Sawaki, N. et al. "Growth and Properties of Semi-Polar GaN on a Patterned Silicone Substrate," Journal of Crystal Growth, 311, pp. 2867-2874 (2009).

Cruz, S. et al. "Crystallographic Orientation Dependence of Dopant and Impurity Incorporation in GaN Films Grown by Metalorganic Chemical Vapor Deposition," Journal of Crystal Growth, 311, 3817-3823 (2009).

Okamoto, K. et al. "Continuous-Wave Operation of *m*-Plane InGaN Multiple Quantum Well Laser Diodes," Japanese Journal of Applied Physics, vol. 46, No. 9, pp. L187-L189 (2007).

* cited by examiner

Fig.3

| Condition | Temperature °C | GR | NH3 | V/III | C |
|---|---|---|---|---|---|
| (1) | 1140 | 3.49 | 5 | 2261 | 0.85E16 |
| (2) | 870 | 0.4 | 6 | 10969 | 1.1E16 |
| (3) | 780 | 0.255 | 6 | 17185 | 25E16 |
| (4) | 780 | 0.174 | 10 | 28641 | 1.6E16 |
| (5) | 780 | 0.109 | | 45826 | 11E16 |
| (6) | 780 | 0.34 | | 14625 | 24E16 |
| (7) | 780 | 0.217 | 8 | | 5.2E16 |
| (8) | 740 | 0.217 | | 22913 | 51E16 |
| (9) | 820 | 0.217 | | | 0.89E16 |
| (10) | 950 | 7.77 | 7.5 | 1373 | 15E16 |

(a)

(b)

(a)

(b)

(c)

III-NITRIDE SEMICONDUCTOR OPTICAL DEVICE AND EPITAXIAL SUBSTRATE

BACKGROUND OF THE INVENTION

1. Field of the Invention

The present invention relates to a III-nitride semiconductor optical device, and an epitaxial substrate for the III-nitride semiconductor optical device.

2. Related Background Art

Non Patent Literature 1 discloses uniform growth of (1-101)-plane GaN on a silicon substrate. This GaN is grown on coalesced stripes of GaN grown by selective metal-organic vapor phase epitaxy on a 7-degree off-axis (001)Si substrate via an AlN intermediate layer. Three types of Samples (A), (B), and (C) were produced. Sample (A) contains GaN grown on an LT-AlN intermediate layer. Sample (B) contains a 30-nm $Al_{0.1}Ga_{0.9}N$ upper layer. Sample (C) contains GaN grown without the LT-AlN intermediate layer. Hall measurements were carried out with the three types of Samples (A), (B), and (C). Sample (A) exhibited p-type conduction and Sample (B) n-type conduction. Sample (C) exhibited n-type, p-type, and n-type conductions in three respective temperature regions (not more than 80 K, 80 K to 200 K, and not less than 200 K) from low temperature to high temperature. Non Patent Literature 1 discloses the following: Samples (A) and (B) contain GaN/AlN/Si hetero-junctions, and the conduction in the hetero junctions is presumed to be the major conduction in Samples (A) and (B).

Non Patent Literature 2 discloses uniform growth of (1-101)-plane GaN on a silicon substrate. This GaN was grown on coalesced stripes of GaN grown by selective metal-organic vapor phase epitaxy on a 7-degree off-axis (001)Si substrate via an AlN intermediate layer. (1-101)-plane GaN was doped with magnesium. For doping with magnesium, a dopant gas $EtCp_2Mg$ was used. In a doped region where a molar ratio of dopant gas/gallium source ($EtCp_2Mg$/TMG) is less than $2\times10^{-3}$, the hole concentration in the GaN film decreases with increase in doping amount of the dopant gas. On the other hand, in a doped region over the molar ratio of $2\times10^{-3}$, the hole concentration increases with increase in doping amount of the dopant gas and becomes saturated at about $1\times10^{18}$ cm$^{-3}$. In growth of c-plane GaN, the grown GaN film in the doped region with the molar ratio of less than $2\times10^{-3}$ demonstrated n-type conduction, but the grown GaN film in the doped region with the molar ratio of more than $2\times10^{-3}$ demonstrated p-type conduction. Non Patent Literature 2 explains this phenomenon as follows: (1-101)-plane GaN consists of a nitrogen plane whereas c-plane GaN consists of a Ga-plane.

Non Patent Literature 3 discloses uniform growth of (1-101)-plane and (11-22)-plane GaN on a silicon substrate. Carbon is added in growth of GaN, using a dopant gas $C_2H_2$. The doping of (11-22)-plane GaN with carbon provides the effect different from that by the doping of (1-101)-plane GaN with carbon.

Some of the authors of Non Patent Literatures 1-3 are the same.

Patent Literature 1 discloses increase in electric resistance of GaN film by increase in carbon concentration.

Patent Literature 1: Japanese Patent Application Laid-open No. 2009-21279

Non Patent Literature 1: T. Hikosaka et al., Applied Physics Letters Vol. 84, No. 23 (2004) pp. 4717-4719.

Non Patent Literature 2: Nobuhiro Sawaki et al., Journal of Crystal Growth 298 2007, pp. 207-210.

Non Patent Literature 3: Nobuhiro Sawaki et al., Journal of Crystal Growth 311 2009, pp. 2867-2874.

SUMMARY OF THE INVENTION

As described in Non Patent Literatures 1 to 3, the heterojunctions are included in the coalesced stripes of GaN grown by selective metal-organic vapor phase epitaxy on the 7-degree off-axis (001)Si substrate via the AlN intermediate layer, and in addition thereto, threading dislocations are highly likely to be included at a high density in GaN. For this reason, the conductions are complicated in the crystallographic structures of GaN coalesced bodies described in Non Patent Literatures 1 to 3.

On the other hand, Patent Literature 1 realizes high resistance by addition of carbon into the GaN film. The behaviors of carbon in the GaN-based semiconductors are complicated as shown in Non Patent Literatures 1 to 3 and Patent Literature 1. According to Inventors' investigation, however, carbon can be stably utilized as a p-type dopant in the GaN-based semiconductors.

It is an object of the present invention to provide a III-nitride semiconductor optical device including a p-type gallium nitride based semiconductor layer with reduced resistance, and it is another object of the present invention to provide an epitaxial substrate for this III-nitride semiconductor optical device.

A III-nitride semiconductor optical device according to one aspect of the present invention comprises: (a) a support base comprised of a III-nitride semiconductor and having a primary surface at an angle of more than zero with respect to a reference plane perpendicular to a reference axis that extends in a c-axis direction of the III-nitride semiconductor; (b) an n-type gallium nitride based semiconductor layer provided over the primary surface of the support base; (c) a p-type gallium nitride based semiconductor layer provided over the primary surface of the support base and doped with magnesium; and (d) an active layer provided between the n-type gallium nitride based semiconductor layer and the p-type gallium nitride based semiconductor layer over the primary surface of the support base. The angle is in the range of not less than 40 degrees and not more than 140 degrees; the primary surface demonstrates either one of semipolar nature and nonpolar nature; the p-type gallium nitride based semiconductor layer contains carbon as a p-type dopant; a carbon concentration of the p-type gallium nitride based semiconductor layer is not less than $2\times10^{16}$ cm$^{-3}$; and the carbon concentration of the p-type gallium nitride based semiconductor layer is not more than $1\times10^{19}$ cm$^{-3}$.

An epitaxial substrate for a III-nitride semiconductor optical device according to another aspect of the present invention comprises: (a) a III-nitride semiconductor substrate comprised of a III-nitride semiconductor and having a primary surface at an angle of more than zero with respect to a reference plane perpendicular to a reference axis that extends in a c-axis direction of the III-nitride semiconductor; (b) an n-type gallium nitride based semiconductor layer provided over the primary surface of the III-nitride semiconductor substrate; (c) a p-type gallium nitride based semiconductor layer provided over the primary surface of the III-nitride semiconductor substrate and doped with magnesium; and (d) an active layer provided between the n-type gallium nitride based semiconductor layer and the p-type gallium nitride based semiconductor layer over the primary surface of the III-nitride semiconductor substrate. The angle is in the range of not less than 40 degrees and not more than 140 degrees; the primary surface demonstrates either one of semipolar nature and nonpolar nature; the p-type gallium nitride based semiconductor layer contains carbon as a p-type dopant; a carbon concentration of the p-type gallium nitride based semiconductor layer is not less than $2\times10^{16}$ cm$^{-3}$; and the carbon concentration of the p-type gallium nitride based semiconductor layer is not more than $1\times10^{19}$ cm$^{-3}$.

In the above-described III-nitride semiconductor optical device and epitaxial substrate, the p-type gallium nitride based semiconductor layer is provided over the primary surface of the support base or the substrate, and this primary surface makes the angle with the c-plane in the angle range of not less than 40 degrees and not more than 140 degrees. In this angle range, carbon in the p-type gallium nitride based semiconductor layer stably acts as a p-type dopant. Furthermore, the p-type gallium nitride based semiconductor layer contains carbon and magnesium both that serve as p-type dopants, and therefore holes are provided from both of carbon and magnesium. Since a doping amount of magnesium necessary for achieving a desired hole concentration can be reduced, it is feasible to avoid deterioration of crystallinity due to the magnesium doping. Since the doping of carbon necessary for achieving the desired hole concentration can be reduced, it is feasible to suppress degradation of morphology due to the carbon doping and thus to avoid deterioration of crystal quality due to the degradation of morphology.

The III-nitride semiconductor optical device and epitaxial substrate according to the above aspects of the present invention can be configured as follows: the active layer includes well layers and barrier layers, which alternately arranged in a direction of an axis normal to the primary surface of the support base, the barrier layers are comprised of a gallium nitride based semiconductor, a thickness of the barrier layer is larger than a thickness of the well layer, the well layers are comprised of a gallium nitride based semiconductor containing indium as a constituent element, and a carbon concentration of the well layers is not more than $1\times10^{17}$ cm$^{-3}$. In the III-nitride semiconductor optical device and epitaxial substrate, since the carbon concentration of the well layers is not more than $1\times10^{17}$ cm$^{-3}$, carbon as a p-type dopant causes no substantial effect on the emission characteristics of the active layer.

In the III-nitride semiconductor optical device and epitaxial substrate according to the foregoing aspects of the present invention, a carbon concentration of the n-type gallium nitride based semiconductor layer is smaller than the carbon concentration of the p-type gallium nitride based semiconductor layer, the n-type gallium nitride based semiconductor layer contains an n-type dopant, and a concentration of the n-type dopant in the n-type gallium nitride based semiconductor layer is larger than the carbon concentration of the n-type gallium nitride based semiconductor layer.

In the III-nitride semiconductor optical device and the epitaxial substrate, the concentration of the n-type dopant in the n-type gallium nitride based semiconductor layer is larger than the carbon concentration of the n-type gallium nitride based semiconductor layer. Carbon acts as a p-type dopant, but carbon of a p-type dopant causes no substantial effect on the n-type conductivity of the n-type gallium nitride based semiconductor layer.

In the III-nitride semiconductor optical device and epitaxial substrate according to the foregoing aspects of the present invention, it is preferable that a carbon concentration of the n-type gallium nitride based semiconductor layer be not more than $1\times10^{18}$ cm$^{-3}$. In the III-nitride semiconductor optical device and epitaxial substrate, an electron concentration in the n-type gallium nitride based semiconductor layer is sufficiently large under the ordinary doping concentration of the n-type dopant.

In the III-nitride semiconductor optical device and epitaxial substrate according to the foregoing aspects of the present invention, the n-type gallium nitride based semiconductor layer can be made of at least either one of InAlGaN and AlGaN. In the present III-nitride semiconductor optical device and epitaxial substrate, carbon as a p-type dopant causes no substantial effect on the n-type conductivity of the gallium nitride based semiconductor thereof.

In the III-nitride semiconductor optical device and epitaxial substrate according to the foregoing aspects of the present invention, it is preferable that the n-type gallium nitride based semiconductor layer be comprised of InAlGaN. In the III-nitride semiconductor optical device and epitaxial substrate, the n-type gallium nitride based semiconductor layer can be provided with appropriate electrical conductivity and desired strain.

In the III-nitride semiconductor optical device and epitaxial substrate according to the foregoing aspects of the present invention, the carbon concentration in the p-type gallium nitride based semiconductor layer can be larger than a magnesium concentration in the p-type gallium nitride based semiconductor layer. In the III-nitride semiconductor optical device and epitaxial substrate, since the activation energy of carbon is smaller than that of magnesium, there is no increase in the doping amount of magnesium necessary for provision of the desired hole concentration.

The III-nitride semiconductor optical device and epitaxial substrate according to the aforementioned aspects of the present invention further comprise: a first optical guide layer provided between the p-type gallium nitride based semiconductor layer and the active layer and comprised of a gallium nitride based semiconductor; and a second optical guide layer provided between the n-type gallium nitride based semiconductor layer and the active layer and comprised of a gallium nitride based semiconductor. At least a part of the first optical guide layer contains magnesium as a p-type dopant; a carbon concentration of the first optical guide layer is not more than $1\times10^{17}$ cm$^{-3}$; a magnesium concentration in the first optical guide layer is not more than $1\times10^{17}$ cm$^{-3}$; and a carbon concentration of the second optical guide layer is not more than $1\times10^{17}$ cm$^{-3}$.

In the III-nitride semiconductor optical device and epitaxial substrate, the mount of carriers originated from carbon can be reduced and therefore optical absorption by free carriers can be reduced.

In the III-nitride semiconductor optical device and epitaxial substrate according to the foregoing aspects of the present invention, the active layer includes a quantum well structure adapted to generate light at a wavelength of not less than 430 nm and not more than 600 nm. The III-nitride semiconductor optical device can further comprise an electron block layer provided between the active layer and the p-type gallium nitride based semiconductor layer. The first optical guide layer includes a first InGaN layer provided between the electron block layer and the active layer, and the second optical guide layer includes a second InGaN layer provided between the active layer and the n-type gallium nitride based semiconductor layer.

In the III-nitride semiconductor optical device and epitaxial substrate, it is feasible to provide a waveguide structure suitable for a light emitting device to generate light at a longer wavelength region.

In the III-nitride semiconductor optical device and epitaxial substrate according to the foregoing aspects of the present invention, the n-type gallium nitride based semiconductor layer, the active layer, and the p-type gallium nitride based semiconductor layer are arranged in a direction of a normal to the primary surface of the support base; the p-type gallium nitride based semiconductor layer is provided on a primary surface of the active layer; the primary surface of the active layer is in the range of not less than 40 degrees and not more than 140 degrees with respect to the reference plane; and the active layer is provided on a primary surface of the n-type gallium nitride based semiconductor layer. In the III-nitride semiconductor optical device and epitaxial substrate, it is feasible to achieve technical contribution of carbon working as a p-type dopant.

The III-nitride semiconductor optical device and epitaxial substrate according to the foregoing aspects of the present invention can further comprise a contact layer provided on a primary surface of the p-type gallium nitride based semiconductor layer and comprised of a p-type gallium nitride based semiconductor. A carbon concentration of the contact layer is not less than $2\times10^{16}$ cm$^{-3}$, and the carbon concentration of the contact layer is not more than $1\times10^{19}$ cm$^{-3}$. In the III-nitride semiconductor optical device and epitaxial substrate, it is also feasible to achieve the technical contribution of carbon working as a p-type dopant in the contact layer.

The III-nitride semiconductor optical device according to the foregoing aspect of the present invention can further comprise a first electrode in contact with the contact layer. In this III-nitride semiconductor optical device, the contact layer contains both of carbon and magnesium as p-type dopants, and therefore the contact layer can be in excellent electrical contact with the electrode.

In the III-nitride semiconductor optical device and epitaxial substrate according to the foregoing aspects of the present invention, it is preferable that the reference axis extending in the c-axis direction be inclined in a direction defined in the range of not less than −15 degrees and not more than +15 degrees with respect to a <11-20> direction of the III-nitride semiconductor of the support base, and the angle between the primary surface of the support base and the reference plane perpendicular to the reference axis that extends in the c-axis direction is in the range of not less than 59 degrees and not more than 121 degrees. In the III-nitride semiconductor optical device and epitaxial substrate, the probability of allowing carbon to serve as a p-type dopant can be more increased.

In the III-nitride semiconductor optical device and epitaxial substrate according to the foregoing aspects of the present invention, it is preferable that the reference axis extending in the c-axis direction be inclined in a direction defined in the range of not less than −15 degrees and not more than +15 degrees with respect to a <11-20> direction of the III-nitride semiconductor of the support base, and the angle between the primary surface of the support base and the reference plane perpendicular to the reference axis that extends in the c-axis direction is in the range of not less than 70 degrees and not more than 80 degrees or in the range of not less than 100 degrees and not more than 110 degrees. In the III-nitride semiconductor optical device and epitaxial substrate, the probability of allowing carbon to serve as a p-type dopant can be more increased.

In the III-nitride semiconductor optical device and epitaxial substrate according to the foregoing aspects of the present invention, preferably, the reference axis extending in the c-axis direction is inclined in a direction defined in the range of not less than −15 degrees and not more than +15 degrees with respect to a <1-100> direction of the III-nitride semiconductor of the support base, and the angle between the primary surface of the support base and the reference plane perpendicular to the reference axis that extends in the c-axis direction is in the range of not less than 63 degrees and not more than 117 degrees. In the III-nitride semiconductor optical device and epitaxial substrate, the probability of allowing carbon to serve as a p-type dopant can be more increased.

In the III-nitride semiconductor optical device and epitaxial substrate according to the foregoing aspects of the present invention, preferably, the reference axis extending in the c-axis direction is inclined in a direction defined in the range of not less than −15 degrees and not more than +15 degrees with respect to a <1-100> direction of the III-nitride semiconductor of the support base, and the angle between the primary surface of the support base and the reference plane perpendicular to the reference axis that extends in the c-axis direction is in the range of not less than 70 degrees and not more than 80 degrees or in the range of not less than 100 degrees and not more than 110 degrees. In the III-nitride semiconductor optical device and epitaxial substrate, the probability of allowing carbon to serve as a p-type dopant can be more increased.

In the III-nitride semiconductor optical device and epitaxial substrate according to the foregoing aspects of the present invention, it is preferable that the primary surface of the support base be in the range of −4 degrees to +4 degrees with respect to any one plane of {11-22}, {11-21}, {11-20}, {11-2-1} and {11-2-2}. In the III-nitride semiconductor optical device and epitaxial substrate, the probability of allowing carbon to serve as a p-type dopant can be more increased.

In the III-nitride semiconductor optical device and epitaxial substrate according to the foregoing aspects of the present invention, preferably, a plane index of the primary surface of the support base is any one of {11-22}, {11-21}, {11-20}, {11-2-1} and {11-2-2}. In the III-nitride semiconductor optical device and epitaxial substrate, these plane indices can further increase the probability of allowing carbon to serve as a p-type dopant.

In the III-nitride semiconductor optical device and epitaxial substrate according to the foregoing aspects of the present invention, the primary surface of the support base can be in the range of −4 degrees to +4 degrees with respect to any one plane of {10-11}, {20-21}, {10-10}, {20-2-1} and {10-1-1}. In the III-nitride semiconductor optical device and epitaxial substrate, carbon can act as a p-type dopant in these angle ranges.

In the III-nitride semiconductor optical device and epitaxial substrate according to the foregoing aspects of the present invention, preferably, a plane index of the primary surface of the support base is any one of {10-11}, {20-21}, {10-10}, {20-2-1} and {10-1-1}. In the III-nitride semiconductor optical device and epitaxial substrate, these plane indices are considered to have arrangements of constituent atoms suitable for allowing carbon to act as a p-type dopant.

In the III-nitride semiconductor optical device according to the foregoing aspect of the present invention, a threading dislocation density of the support base is not more than $1\times10^{7}$ cm$^{-2}$, and the support base can be comprised of any one of GaN, InGaN, AlGaN and InAlGaN. In the epitaxial substrate according to the other aspect of the present invention, a threading dislocation density of the III-nitride semiconductor substrate is not more than $1\times10^{7}$ cm$^{-2}$, and the III-nitride semiconductor substrate can be comprised of any one of GaN, InGaN, AlGaN and InAlGaN.

In the III-nitride semiconductor optical device and epitaxial substrate, influence of threading dislocations on activation of the p-type dopant can be reduced in the gallium nitride based semiconductor layer grown on the region with the threading dislocation density of not more than $1 \times 10^7$ cm$^{-2}$.

In the III-nitride semiconductor optical device according to the foregoing aspect of the present invention, the support base is preferably comprised of GaN. In the epitaxial substrate according to the other aspect of the present invention, the substrate is preferably comprised of GaN. A low-dislocation GaN substrate is available.

The III-nitride semiconductor optical device according to the foregoing aspect of the present invention can further comprise a second electrode in contact with a back surface of the support base. The support base demonstrates electrical conductivity. In this III-nitride semiconductor optical device, the support base can provide an epitaxial region in which carbon can act as a p-type dopant and can provide excellent electrical contact.

In the III-nitride semiconductor optical device and epitaxial substrate according to the foregoing aspects of the present invention, the p-type gallium nitride based semiconductor layer can be comprised of at least either of InAlGaN and AlGaN. In the III-nitride semiconductor optical device and epitaxial substrate, carbon of a p-type dopant effectively acts to provide these gallium nitride based semiconductors with a p-type conductivity.

In the III-nitride semiconductor optical device and epitaxial substrate according to the foregoing aspects of the present invention, the p-type gallium nitride based semiconductor layer is preferably comprised of InAlGaN. The III-nitride semiconductor optical device and epitaxial substrate can provide appropriate electrical conductivity and desired strain.

In the III-nitride semiconductor optical device and epitaxial substrate according to the foregoing aspects of the present invention, the active layer includes well layers and barrier layers, which are alternately arranged in a direction of a axis normal to the primary surface of the support base, the barrier layers are comprised of a gallium nitride based semiconductor, a thickness of the barrier layer is larger than a thickness of the well layer, the well layers are comprised of a gallium nitride based semiconductor containing indium as a constituent element, a carbon concentration of the well layers is not more than $1 \times 10^{17}$ cm$^{-3}$, a carbon concentration of the n-type gallium nitride based semiconductor layer is smaller than the carbon concentration of the p-type gallium nitride based semiconductor layer, the n-type gallium nitride based semiconductor layer contains an n-type dopant, and a concentration of the n-type dopant in the n-type gallium nitride based semiconductor layer is larger than the carbon concentration of the n-type gallium nitride based semiconductor layer.

This epitaxial substrate can achieve the technical contribution of carbon of a p-type dopant, and can reduce the influence of carbon in the n-type gallium nitride based semiconductor layer and the active layer.

BRIEF DESCRIPTION OF THE DRAWINGS

The above object and other objects, features, and advantages of the present invention can more readily become clear in view of the following detailed description of the preferred embodiments of the present invention proceeding with reference to the accompanying drawings.

FIG. 3 is a drawing showing a relation between growth conditions used in growth conditions (1) to (10) of GaN in FIG. 2 and carbon concentrations in GaN.

LIST OF REFERENCE SIGNS

11: III-nitride semiconductor optical device;
13: support base;
13a: primary surface of support base;
13b: back surface of support base;
15: n-type gallium nitride based semiconductor layer;
17: p-type gallium nitride based semiconductor layer;
19: active layer;
19a: primary surface of active layer;
21: electron block layer;
NV: normal vector;
Nx: normal axis;
ALPHA: angle;
VC: c-axis vector;
Cx: reference axis;
23a: barrier layers;
23b: well layers;
25, 27: optical guide layers;
25a: InGaN layer;
25b: GaN layer;
27a: InGaN layer;
27b: GaN layer;
29: light emitting layer;
29a: primary surface of light emitting layer;
Sc: reference plane;
31: contact layer;
Ax: extending axis;
33, 37: electrodes;
35: insulating film.

DETAILED DESCRIPTION OF THE PREFERRED EMBODIMENTS

The expertise of the present invention will become readily understood in view of the following detailed description with reference to the accompanying drawings presented by way of illustration. The below will describe embodiments of the present invention of a III-nitride semiconductor optical device, an epitaxial substrate and a method for fabricating the III-nitride semiconductor optical device and epitaxial substrate. The same portions are denoted by the same reference signs if possible.

Figure 1:
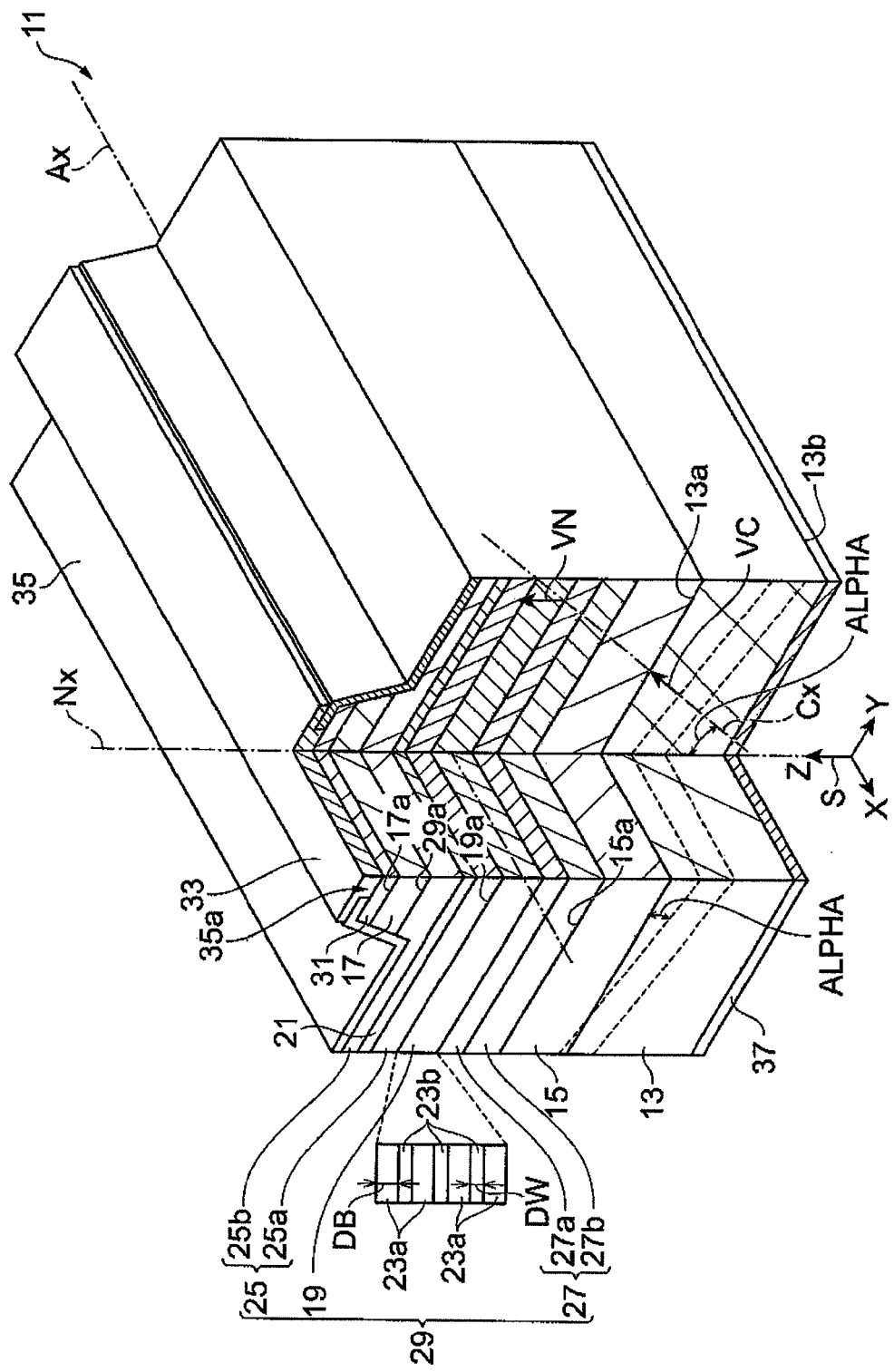
FIG. 1 is a drawing showing a III-nitride semiconductor optical device according to an embodiment of the present invention.

FIG. 1 is a drawing showing a III-nitride semiconductor optical device according to an embodiment of the present invention. The III-nitride semiconductor optical device can be a semiconductor light emitting device, such as a semiconductor laser or a light emitting diode. The semiconductor laminate shown in FIG. 1 shows a structure of an epitaxial substrate for the semiconductor light emitting device. An orthogonal coordinate system S is depicted with reference to FIG. 1.

The III-nitride semiconductor optical device 11 has a support base 13, an n-type gallium nitride based semiconductor layer 15, a p-type gallium nitride semiconductor layer 17, and an active layer 19. The support base 13 is comprised of a III-nitride semiconductor. The III-nitride semiconductor is comprised of $In_SAl_TGa_{1-S-T}N$ ($0 \leq S \leq 1$, $0 \leq T \leq 1$, $S+T \neq 1$) and can be, for example, GaN, InGaN, AlGaN, InAlGaN, or the like. The support base 13 has a primary surface 13a and a back surface 13b, and a normal axis Nx along a normal direction (direction indicated by a normal vector NV) to the primary surface 13a is directed along the positive direction of the z-axis. The primary surface 13a makes an angle ALPHA larger than zero with respect to a reference plane Sc, and the reference plane Sc is perpendicular to a reference axis Cx that extends in a direction of the c-axis of the III-nitride semiconductor (which is a direction indicated by a c-axis vector VC). The angle ALPHA is not less than 40 degrees and not more than 140 degrees. The primary surface 13a demonstrates either one of semipolar nature and nonpolar nature. The n-type gallium nitride based semiconductor layer 15 is provided over the primary surface 13a of the support base 13 and covers the primary surface 13a. The p-type gallium nitride based semiconductor layer 17 is provided over the primary surface 13a. The n-type gallium nitride based semiconductor layer 15, active layer 19, and p-type gallium nitride based semiconductor layer 17 are arranged in the direction of the normal axis Nx on the primary surface 13a of the support base 13. The active layer 19 is provided between the n-type gallium nitride based semiconductor layer 15 and the p-type gallium nitride based semiconductor layer 17.

The p-type gallium nitride based semiconductor layer 17 is doped with a p-type dopant, e.g., magnesium, and the n-type gallium nitride based semiconductor layer 15 is doped with an n-type dopant, e.g., silicon. The p-type gallium nitride based semiconductor layer 17 contains carbon as a p-type dopant. The p-type gallium nitride based semiconductor layer 17 contains carbon in a carbon concentration of not less than $2 \times 10^{16}$ cm$^{-3}$, and this concentration range allows the supply of holes. The carbon concentration is not more than $1 \times 10^{19}$ cm$^{-3}$, and this concentration range can reduce deterioration of the surface morphology of the semiconductor that contains carbon as a p-type dopant.

In this III-nitride semiconductor optical device 11, the p-type gallium nitride based semiconductor layer 17 is provided over the primary surface 13a of the support base 13, and this primary surface 13a is inclined at an angle in the range of not less than 40 degrees and not more than 140 degrees with respect to the c-plane. In this inclination angle range, when the p-type gallium nitride based semiconductor layer 17 over the primary surface 13a contains carbon, the carbon added thereto serves as a p-type dopant on a stable basis. The p-type gallium nitride based semiconductor layer 17 contains carbon and magnesium both which serve as p-type dopants. For this reason, carbon and magnesium both provide holes. This configuration can decrease a doping amount of magnesium necessary for providing a desired hole concentration, which can avoid degradation of crystallinity due to the magnesium doping.

The p-type gallium nitride based semiconductor layer 17 can be comprised of at least one of an InAlGaN layer and an AlGaN layer. Carbon acts as an effective p-type dopant to provide these gallium nitride based semiconductors with p-type conductivity. It is preferable that the p-type gallium nitride based semiconductor layer 17 be made of InAlGaN. InAlGaN allows for provision of appropriate electrical conductivity and desired strain.

In the III-nitride semiconductor optical device 11, the active layer 19 can have a single quantum well structure or a multiple quantum well structure, but the structure does not always have to be limited to these structures, however. The active layer 19 includes barrier layers 23a and well layers 23b. The barrier layers 23a and well layers 23b are alternately arranged in the direction of the axis Nx normal to the primary surface 13a of the support base 13. The barrier layers 23a are comprised of a GaN-based semiconductor, e.g., GaN or InGaN or the like. The well layers 23b are comprised of a gallium nitride based semiconductor containing indium as a constituent element, e.g., InGaN. The thickness DB of the barrier layers 23a is larger than the thickness DW of the well layers 23b. A carbon concentration of the well layers 23b can be not more than $1 \times 10^{17}$ cm$^{-3}$. Since the carbon concentration of the well layers is not more than $1 \times 10^{17}$ cm$^{-3}$, carbon as a p-type dopant causes no substantial effect on the emission characteristics of the active layers 19. The carbon effect can be reduced in the n-type gallium nitride based semiconductor layer 15 and the active layer 19.

The carbon concentration of the n-type gallium nitride gallium nitride based semiconductor layer 15 is smaller than that of the p-type gallium nitride based semiconductor layer 17. The n-type gallium nitride based semiconductor layer 15 contains an n-type dopant, and a concentration of the n-type dopant in the n-type gallium nitride based semiconductor layer 15 is larger than the carbon concentration of the n-type gallium nitride based semiconductor layer 15. For this reason, carbon in the n-type gallium nitride based semiconductor layer acts as a p-type dopant, but the carbon as the p-type dopant causes no substantial effect on the n-type conductivity of the n-type gallium nitride based semiconductor layer 15. It is preferable that the carbon concentration of the n-type gallium nitride based semiconductor layer 15 be not more than $1 \times 10^{18}$ cm$^{-3}$. When the n-type gallium nitride based semiconductor layer is doped with n-type dopant of an ordinary doping concentration, the n-type gallium nitride based semiconductor layer has a sufficiently large electron concentration.

The n-type gallium nitride based semiconductor layer 15 can be comprised of at least either one of an InAlGaN layer and an AlGaN layer. Carbon as a p-type dopant causes no substantial effect on the n-type conductivity of these gallium nitride based semiconductors. When the n-type gallium nitride based semiconductor layer 15 is comprised of InAl- GaN, the n-type gallium nitride based semiconductor layer 15 can be provided with appropriate electrical conductivity and desired strain.

The carbon concentration in the p-type gallium nitride based semiconductor layer 17 can be larger than a magnesium concentration in the p-type gallium nitride based semiconductor layer 17. In gallium nitride based semiconductors such as GaN, InAlGaN or AlGaN, the activation energy of carbon is smaller than that of magnesium, and thus there is no increase in the doping amount of magnesium necessary for provision of the desired hole concentration in the p-type gallium nitride based semiconductor layer 17.

When the III-nitride semiconductor optical device 11 constitutes a semiconductor laser, the p-type gallium nitride based semiconductor layer 17 serves as a cladding layer, and the n-type gallium nitride based semiconductor layer 15 serves as a cladding layer.

When the III-nitride semiconductor optical device 11 constitutes a semiconductor laser, the III-nitride semiconductor optical device 11 includes a first optical guide layer 25 and this optical guide layer 25 is comprised of a GaN-based semiconductor such as GaN or InGaN. The first optical guide layer 25 is provided between the p-type gallium nitride based semiconductor layer 17 and the active layer 19. A carbon concentration of the first optical guide layer 25 can be not more than $1 \times 10^{17}$ cm$^{-3}$ which allows this optical guide layer 25 to reduce generation of carriers by carbon, resulting in decrease in optical absorption by free carriers. If needed, magnesium can be further added at least to part of the first optical guide layer 25, and a concentration of this magnesium is not more than $1 \times 10^{17}$ cm$^{-3}$. The first optical guide layer 25 does not always have to be doped with magnesium.

The first optical guide layer 25 can be comprised of a single gallium nitride based semiconductor layer or plural gallium nitride based semiconductor layers. In an example, the first optical guide layer 25 can be made of an InGaN layer 25a and a GaN layer 25b. The InGaN layer 25a is provided between the GaN layer 25b and the active layer 19. An electron block layer 21 is located between the p-type gallium nitride based semiconductor layer 17 and the active layer 19, and in FIG. 1 the electron block layer 21 is located between the InGaN layer 25a and the GaN layer 25b. A material of the electron block layer 21 has a bandgap larger than those of the InGaN layer 25a and the GaN layer 25b, and the thickness of the electron block layer 21 is smaller than the thickness of the InGaN layer 25a and the thickness of the GaN layer 25b. The electron block layer 21 can be comprised, for example, of AlGaN or the like.

When the III-nitride semiconductor optical device 11 constitutes a semiconductor laser, the III-nitride semiconductor optical device 11 includes a second optical guide layer 27, and this optical guide layer 27 is comprised of a gallium nitride based semiconductor such as GaN or InGaN. The second optical guide layer 27 is provided between the n-type gallium nitride based semiconductor layer 15 and the active layer 19. A carbon concentration of the second optical guide layer 27 is not more than $1 \times 10^{17}$ cm$^{-3}$, which can reduce carrier generation by carbon, resulting in decrease in the optical absorption by free carriers.

The second optical guide layer 27 can be comprised of a single gallium nitride based semiconductor layer or plural gallium nitride based semiconductor layers. In an example, the second optical guide layer 27 can be made of an InGaN layer 27a and a GaN layer 27b. The InGaN layer 27a is located between the GaN layer 27b and the active layer 19.

In the III-nitride semiconductor optical device 11, the active layer 19 can be constituted to generate light in a wavelength range of not less than 430 nm and not more than 600 nm. The first optical guide layer 25 contains the InGaN layer, and the second optical guide layer 27 contains the InGaN layer. The active layer 19 is in contact with the InGaN layer of the first optical guide layer 25 and with the InGaN layer of the second optical guide layer 27. The laminate of the InGaN layer of the first optical guide layer 25, the active layer 19, and the InGaN layer of the second optical guide layer 27 can provide a waveguide core structure suitable for a light emitting device to generate light having a longer wavelength.

The n-type gallium nitride based semiconductor layer 15, light emitting layer 29, and p-type gallium nitride based semiconductor layer 17 are arranged in the direction of the normal axis Nx to the primary surface 13a of the support base 13. The light emitting layer 29 includes the active layer 19 and if needed, it can further include the optical guide layers 25 and 27.

The p-type gallium nitride based semiconductor layer 17 (or the semiconductor layer 21) is provided over a primary surface 19a of the active layer 19, and this p-type GaN-based semiconductor layer is in contact on a primary surface 29a of the light emitting layer 29. The primary surface 29a of the light emitting layer 29 (similarly, the primary surface 19a of the active layer 19) is inclined at an angle in the range of not less than 40 degrees and not more than 140 degrees with respect to the reference plane Sc. Since the p-type gallium nitride based semiconductor layer 17 is an epitaxial film epitaxially grown on the semiconductor region that demonstrates semipolar or nonpolar nature, the behavior of carbon is different from that in an epitaxial film epitaxially grown on the c-plane semiconductor region that demonstrates polar nature. Technical contribution of carbon as a p-type dopant can be achieved in the p-type gallium nitride based semiconductor layer 17. Carbon acts as a p-type dopant throughout the entire p-type gallium nitride based semiconductor layer 17.

A primary surface 15a of the n-type gallium nitride based semiconductor layer 15 can have a tilt angle in the range of not less than 40 degrees and not more than 140 degrees with respect to the reference plane Sc. Since the light emitting layer 29 and active layer 19 are provided on the primary surface 15a of the n-type gallium nitride based semiconductor layer 15, the strength of the piezoelectric field in the light emitting layer 29 and the active layer 19 is small because of the semipolar nature and nonpolar nature which depends on the plane orientation of the underlying layer. The inclination of the primary surface 15a of the n-type gallium nitride based semiconductor layer 15 can work as an underlying layer capable of providing the technical contribution of carbon as a p-type dopant in the p-type gallium nitride based semiconductor layer 17.

The III-nitride semiconductor optical device 11 can further include a contact layer 31. The contact layer 31 is provided on a primary surface 17a of the p-type gallium nitride based semiconductor layer 17 and is comprised of a p-type gallium nitride based semiconductor. A carbon concentration of the contact layer 31 can be not less than $2 \times 10^{16}$ cm$^{-3}$. The technical contribution of carbon as a p-type dopant can be also achieved in the contact layer 31. The carbon concentration of the contact layer 31 is not more than $1 \times 10^{19}$ cm$^{-3}$. The addition of carbon causes deterioration of crystal quality.

If needed, a ridge structure can be provided in the contact layer 31, p-type gallium nitride based semiconductor layer 17 and first optical guide layer 25. The ridge structure extends along a direction of an axis Ax which is an extending direction of a laser stripe.

The III-nitride semiconductor optical device 11 can further have a first electrode 33 provided on the contact layer 31. The first electrode 33 is in contact with the contact layer 31 through an aperture 35a of an insulating film 35 which covers the surface of the epitaxial laminate. In this III-nitride semiconductor optical device 11, the contact layer 31 contains both of carbon and magnesium as p-type dopants, and therefore the contact layer 31 can make good electrical contact with the electrode 33.

When the III-nitride semiconductor optical device 11 has the ridge structure, the aperture 35a of the insulating film 35 is located in the top surface of the ridge structure and the insulating film 35 covers all the sides of the ridge structure.

In the above description, the primary surface 29a of the light emitting layer 29 (similarly, the primary surface 19a of the active layer 19) is inclined at an angle in the range of not less than 40 degrees and not more than 140 degrees with respect to the reference plane Sc. The primary surface 13a of the support base 13 can be inclined toward the direction of the a-axis that corresponds to the crystal orientation <11-20>. This inclination angle is preferably in the range of not less than 59 degrees and not more than 121 degrees. Particularly, the inclination angle is preferably in the range of not less than 70 degrees and not more than 80 degrees or the inclination angle is preferably in the range of not less than 100 degrees and not more than 110 degrees. In these angle ranges, carbon can serve as a p-type dopant. The reference axis extending in the c-axis direction can be inclined in a direction which is in the range of not less than −15 degrees and not more than +15 degrees with respect to the <11-20> direction of the III-nitride semiconductor of the support base 13. In this example, the inclination angle is preferably in the range of not less than 59 degrees and not more than 121 degrees. In these angle ranges, the probability of allowing carbon to serve as a p-type dopant can be further increased. Furthermore, the inclination angle is preferably in the range of not less than 70 degrees and not more than 80 degrees. In these angle ranges, the probability of allowing carbon to serve as a p-type dopant can be more increased.

In the above description, the primary surface 29a of the light emitting layer 29 (similarly, the primary surface 19a of the active layer 19) is inclined at an angle in the range of not less than 40 degrees and not more than 140 degrees with respect to the reference plane Sc. The primary surface 13a of the support base 13 can be inclined toward the direction of the m-axis which corresponds to the crystal orientation <1-100>. This inclination angle is preferably in the range of not less than 63 degrees and not more than 117 degrees. Particularly, the inclination angle is preferably in the range of not less than 70 degrees and not more than 80 degrees, or the inclination angle is preferably in the range of not less than 100 degrees and not more than 110 degrees. In these angle ranges, carbon can serve as a p-type dopant. The reference axis extending in the c-axis direction is preferably inclined in a direction which is in a range of not less than −15 degrees and not more than +15 degrees with respect to the <1-100> direction of the III-nitride semiconductor of the support base 13. In this example, the foregoing inclination angle is preferably in the range of not less than 63 degrees and not more than 117 degrees. In these angle ranges, the probability of allowing carbon to serve as a p-type dopant can be more increased. Particularly, the foregoing inclination angle is preferably in the range of not less than 70 degrees and not more than 80 degrees, or the inclination angle is preferably in the range of not less than 100 degrees and not more than 110 degrees. In these angle ranges, carbon can serve as a p-type dopant.

The primary surface 13a of the support base 13 can be inclined toward the direction of the a-axis indicated by the crystal orientation <11-20>. When the inclination is defined toward the a-axis direction, the primary surface 13a of the support base 13 has a plane orientation preferably in the range of −4 degrees to +4 degrees from any one plane of {11-22}, {11-21}, {11-20}, {11-2-1} and {11-2-2}. In these angle ranges, carbon can serve as a p-type dopant. A plane index of the primary surface 13a of the support base 13 is preferably one of {11-22}, {11-21}, {11-20}, {11-2-1}, and {11-2-2}. These plane indices are considered to have arrangements of constituent atoms suitable for allowing carbon to serve as a p-type dopant.

Alternatively, the primary surface 13a of the support base 13 can be inclined toward the direction of the m-axis indicated by the crystal orientation <1-100>. When the inclination is defined toward the m-axis direction, the primary surface 13a of the support base 13 can be slightly inclined in the range of −4 degrees to +4 degrees from any one plane of {10-11}, {20-21}, {10-10}, {20-2-1}, and {10-1-1}. In these angle ranges, carbon can serve as a p-type dopant. A plane index of the primary surface 13a of the support base 13 is preferably one of {10-11}, {20-21}, {10-10}, {20-2-1}, and {10-1-1}. These plane indices are considered to have arrangements of constituent atoms suitable for allowing carbon to serve as a p-type dopant.

The threading dislocation density of the support base 13 can be not more than $1 \times 10^7$ cm$^{-2}$. In a gallium nitride based semiconductor layer grown on the region in the threading dislocation density of not more than $1 \times 10^7$ cm$^{-2}$, influence of threading dislocations can be reduced on activation of the p-type dopant. The support base 13 can be comprised of one of GaN, InGaN, AlGaN, and InAlGaN.

The region that has a threading dislocation density of not more than $1 \times 10^7$ cm$^{-2}$ can be provided in part of the support base 13. In this low-dislocation region, the influence on the activation of the p-type dopant can be reduced. For this reason, the region of the low threading dislocation density is applicable to the semiconductor laser. A gallium nitride based semiconductor layer grown on a region having a threading dislocation density of not more than $1 \times 10^5$ cm$^{-2}$ can further reduce the influence of threading dislocations on the activation of the p-type dopant. The region of this threading dislocation density can provide a laser stripe with substantially zero dislocation. The support base 13 is preferably comprised of GaN because low-dislocation gallium nitride is available.

This support base 13 can demonstrate electrical conductivity. The III-nitride semiconductor optical device 11 can further have a second electrode 37 which is in contact with the back surface 13b of the support base 13. The support base 13 can provide an epitaxial region in which carbon can act as a p-type dopant and can also provide good electrical contact with n-type nature.

Figure 2:
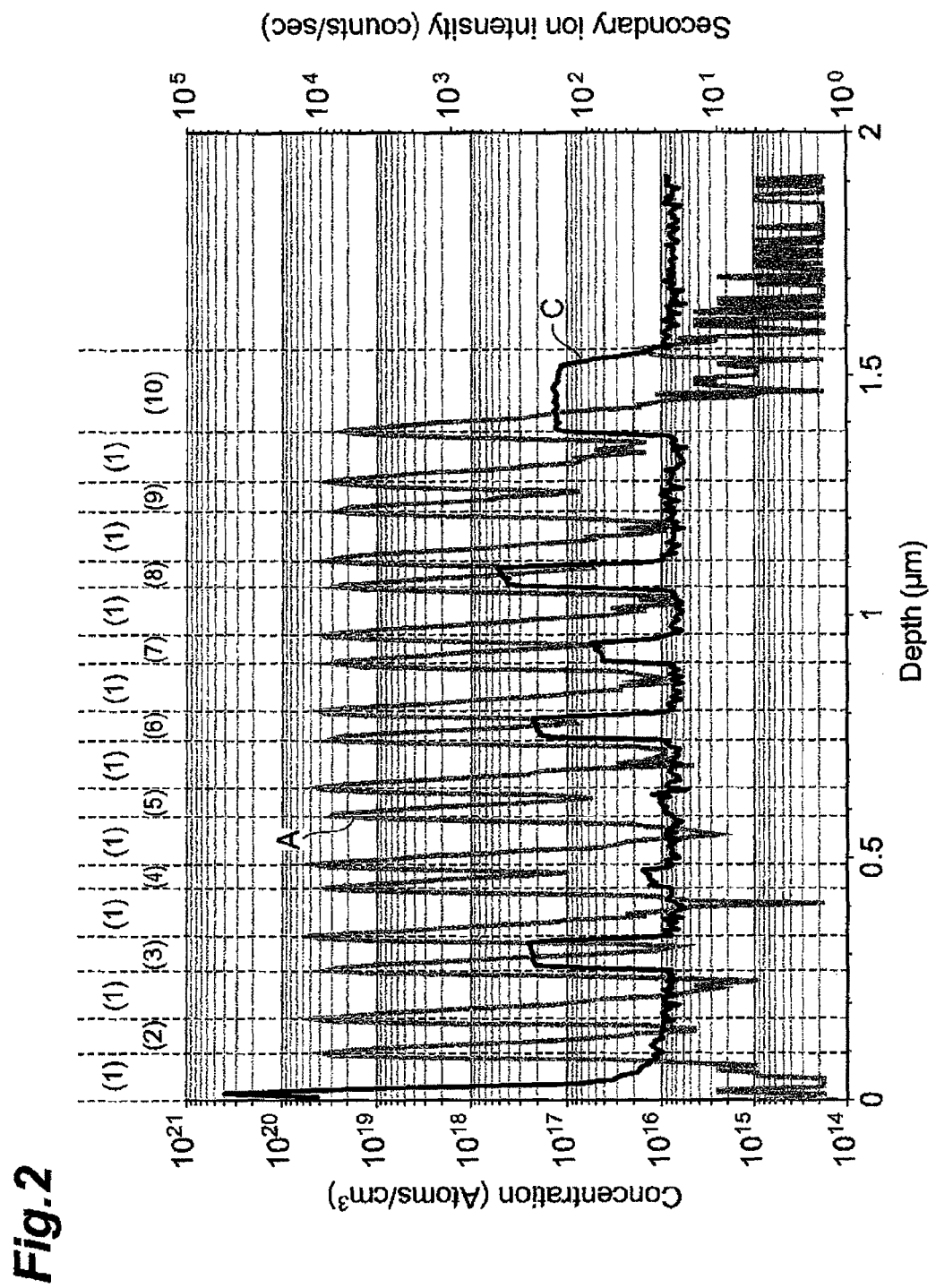
FIG. 2 is a drawing showing a carbon profile measured by secondary ion mass spectrometry to investigate carbon concentrations of GaN grown on semipolar GaN under various growth conditions by metal-organic vapor phase epitaxy.

FIG. 2 is a drawing showing a carbon profile measured by secondary ion mass spectrometry in order to investigate carbon concentrations of GaN layers grown on semipolar GaN under various growth conditions by metal-organic vapor phase epitaxy. In FIG. 2, characteristic lines C and A represent profiles of carbon concentrations and aluminum concentrations, respectively. Aluminum is added in the composition of not more than 0.1% as a marker for indicating locations at which the growth conditions are changed. FIG. 3 is a drawing showing the relationship between the carbon concentrations in the GaN layers and the growth conditions used in growth conditions (1) to (10) of the GaN layers in FIG. 2. In the growth of GaN, trimethyl gallium (TMG) is used as an organic gallium source. In FIG. 3, the unit of temperature is "Celsius," the unit of growth rate GR is "μm/hour," the unit of flow rate of ammonia (NH$_3$) is "slm (flow rate in liter unit per minute in a standard state)," and the unit of carbon concentration is "cm$^{-3}$." V/III (molar flow rate ratio) and carbon concentration "C" are shown in FIG. 3. The expression of carbon concentration, for example, "0.85E16" represents $0.85 \times 10^{16}$.

Figure 4:
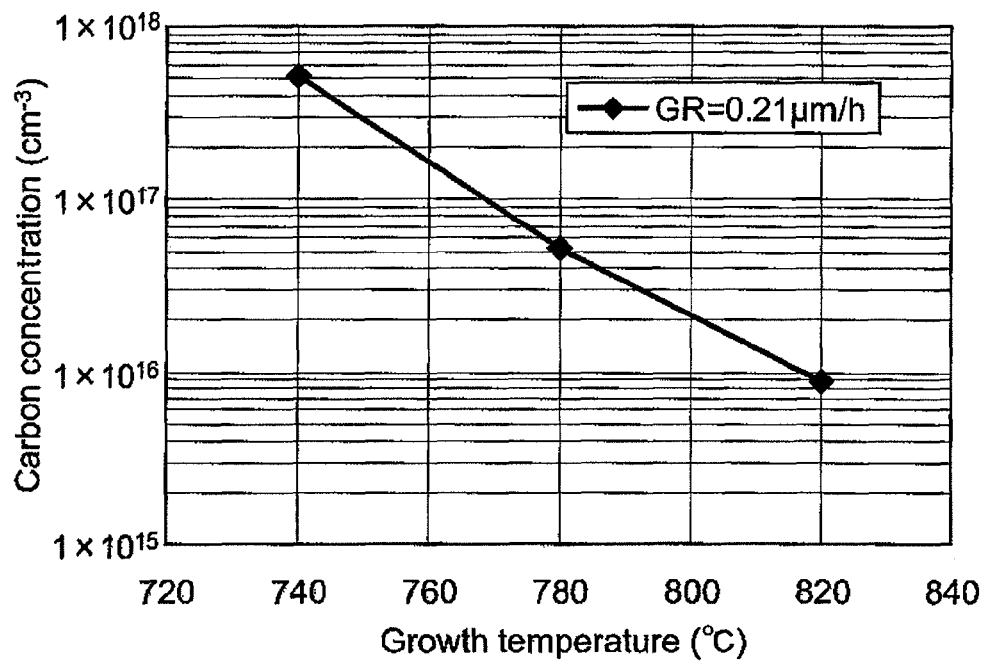
FIG. 4 is a drawing showing relations of carbon concentration in GaN film grown, with growth temperature and V/III.
Figure 4:
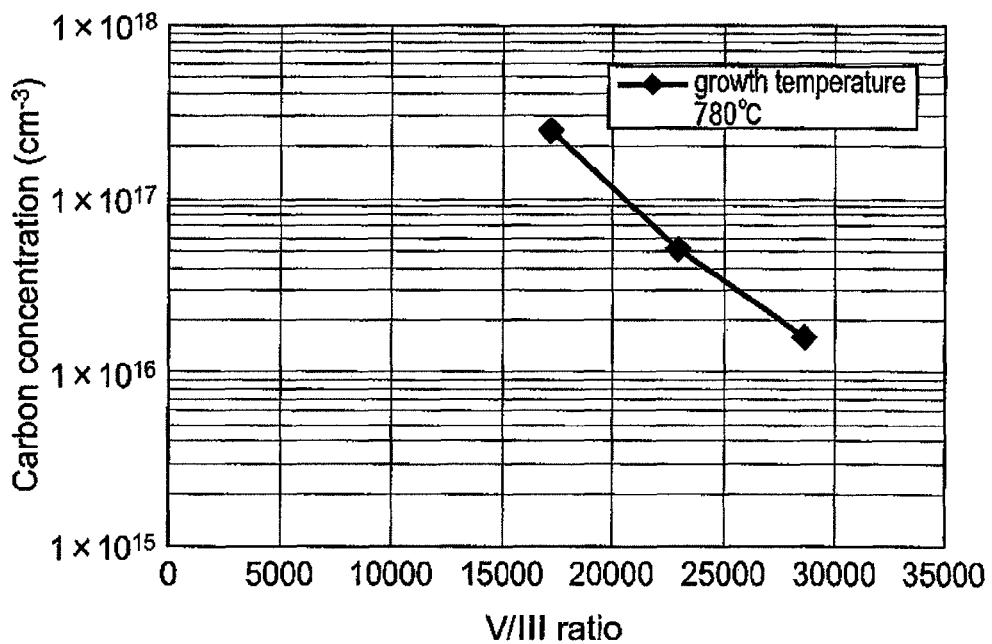

FIG. 4 is a drawing showing relations between carbon concentration in grown GaN film and the growth temperature and V/III. With reference to part (a) of FIG. 4, the carbon concentration monotonically decreases with increase in temperature in the growth temperature range (740° C.-780° C.-820° C.) under the condition of a growth rate of 0.21 μm/hour. With reference to part (b) of FIG. 4, the carbon concentration monotonically decreases with increase in V/III ratio under the condition of the growth temperature of 780 Celsius degrees.

As understood from the experiments shown in FIGS. 2 to 4, in the growth of the gallium nitride based semiconductor on the semipolar plane (similarly, on a non-polar plane) of the GaN-based semiconductor, the concentration of carbon as a p-type dopant can be controlled without need for supplying the carbon dopant in addition to the Group III source and Group V source. The carbon dopant can be supplied separately from the raw materials if needed. For example, if methane represented by chemical formula $CH_4$ is supplied thereto during the growth, a relatively high carbon concentration of not less than $5 \times 10^{18}$ cm$^{-3}$ can be readily realized.

Figure 7:
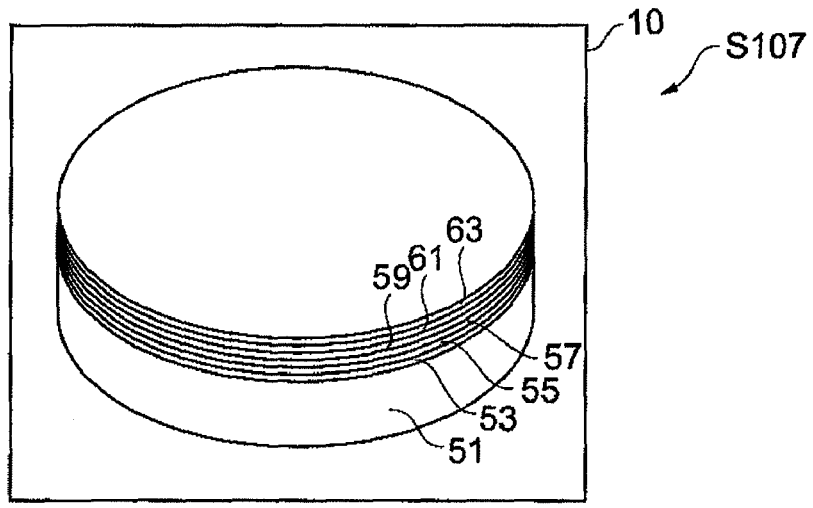
FIG. 7 is a drawing schematically showing major steps in the method for fabricating the III-nitride semiconductor optical device and epitaxial substrate.
Figure 7:
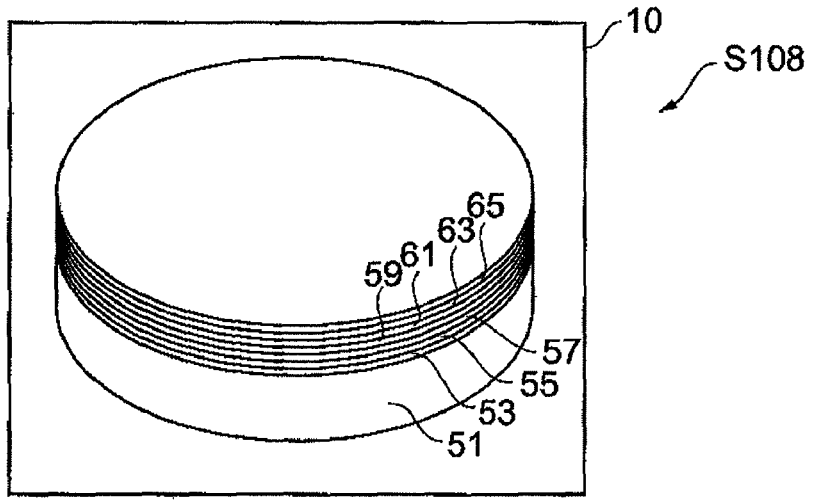
Figure 7:
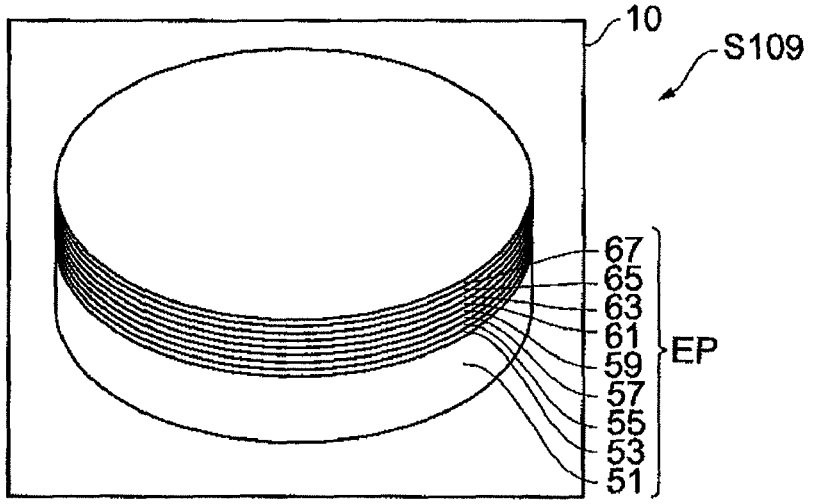
Figure 8:
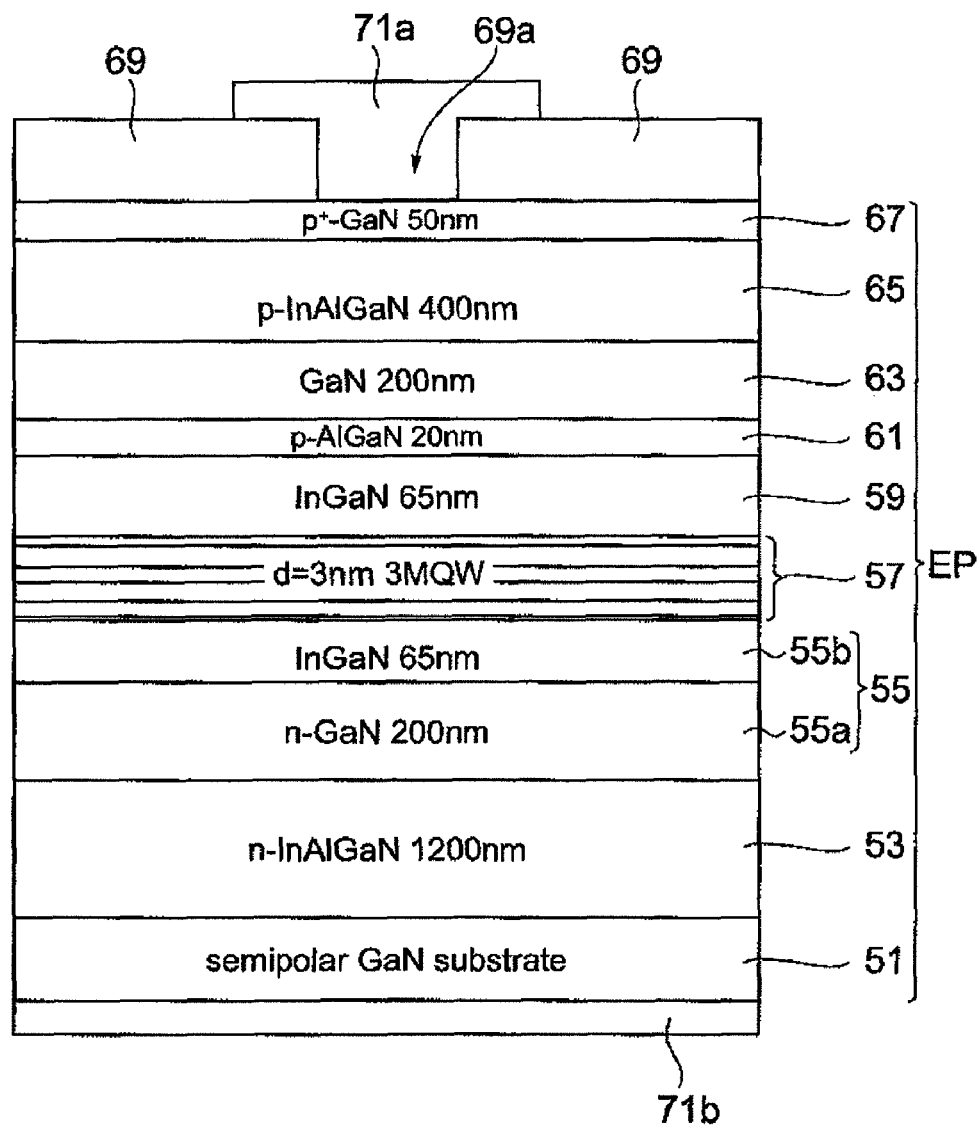
FIG. 8 is a drawing showing a laser diode structure (LD1) and an epitaxial substrate thereof according to an embodiment.

A method of fabricating a III-nitride semiconductor optical device and an epitaxial substrate will be described with reference to FIGS. 5 to 7. FIG. 8 is a drawing schematically showing a semiconductor laser in the present embodiment. In this fabrication method, an epitaxial substrate of the laser diode structure (LD1) shown in FIG. 8 is fabricated, for example, on a GaN substrate having a semipolar or nonpolar primary surface. Raw materials used for epitaxial growth are as follows: trimethyl gallium (TMG); trimethyl indium (TMI); trimethyl aluminum (TMA); ammonia ($NH_3$); silane ($SiH_4$); and bis(cyclopentadienyl) magnesium ($Cp_2Mg$).

A GaN substrate is prepared, and this GaN substrate has an inclination angle, for example, in the inclination angle range of 63 degrees to 80 degrees. In a crystal coordinate system CR shown in part (a) of FIG. 5, the prepared GaN substrate 51 has, for example, a primary surface inclined at the angle of 75 degrees with respect to a plane perpendicular to the c-axis of hexagonal GaN toward the m-axis direction, and this inclined primary surface 51a is indicated as a {20-21} plane. This primary surface is mirror-polished. The epitaxial growth onto the GaN substrate 51 is carried out under the following condition.

First, the GaN substrate 51 is placed in a growth reactor 10. In step S101, as shown in part (a) of FIG. 5, a thermal treatment is carried out for ten minutes under flow of a thermal treatment gas G0 containing ammonia and hydrogen ($H_2$), for example, at a temperature of 1050 Celsius degrees and at an in-reactor pressure of 27 kPa. The surface modification caused by this thermal treatment results in forming a step-and-terrace structure, defined by an off-axis angle, on the surface of the GaN substrate 51.

A gallium nitride based semiconductor region is grown after this thermal treatment. For example, in step S102, as shown in part (b) of FIG. 5, a source gas G1 containing TMG; TMA, TMI, ammonia and silane is supplied to the growth reactor 10, for example, at 1100 Celsius degrees, to grow an n-type cladding layer 53. The n-type cladding layer 53 is made of, for example, a Si-doped InAlGaN layer. The thickness of the InAlGaN layer is, for example, 1.2 micrometers. The growth temperature is, for example, 900 Celsius degrees, the Al composition of the layer is, for example, 0.14, and the In composition of the layer is, for example, 0.03.

Figure 5:
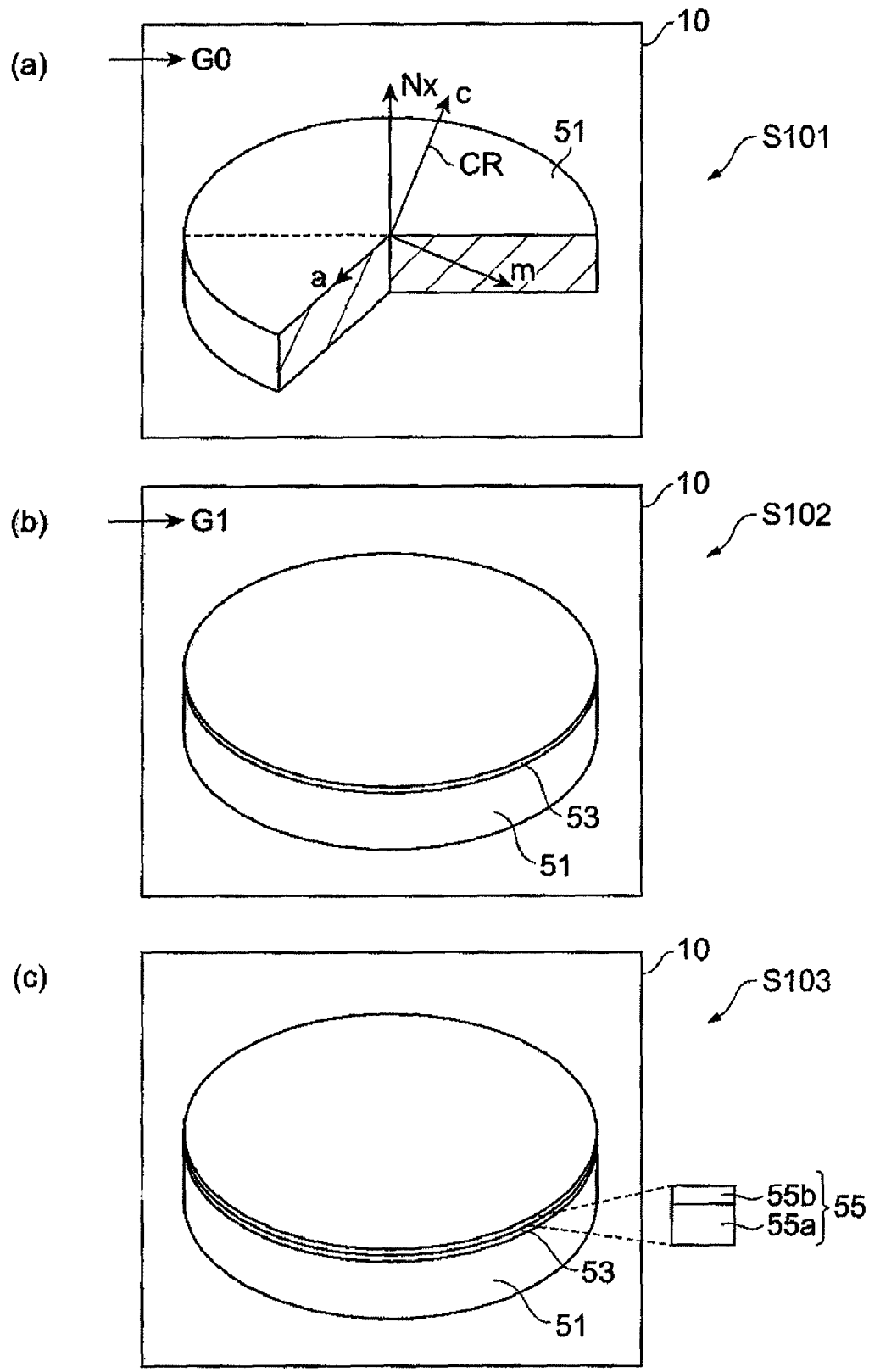
FIG. 5 is a drawing schematically showing major steps in a method for fabricating a III-nitride semiconductor optical device and an epitaxial substrate.

Next, as shown in part (c) of FIG. 5, in step S103 an optical guide layer 55 is grown on the n-type cladding layer 53. The optical guide layer 55 includes, for example, a Si-doped GaN layer 55a and an undoped InGaN layer 55b, and the indium composition thereof can be 0.02. First, TMG, ammonia and silane are supplied to the growth reactor 10 to grow the Si-doped GaN layer 55a on the n-type cladding layer 53 at the growth temperature of 840 Celsius degrees. Then TMG, TMI and ammonia are supplied to the growth reactor 10 to grow the undoped InGaN layer 55b on the Si-doped GaN layer 55a at the growth temperature of 840 Celsius degrees. The thickness of the Si-doped GaN layer 55a is, for example, 200 nm and the thickness of the undoped InGaN layer 55b, for example, 65 nm.

Figure 6:
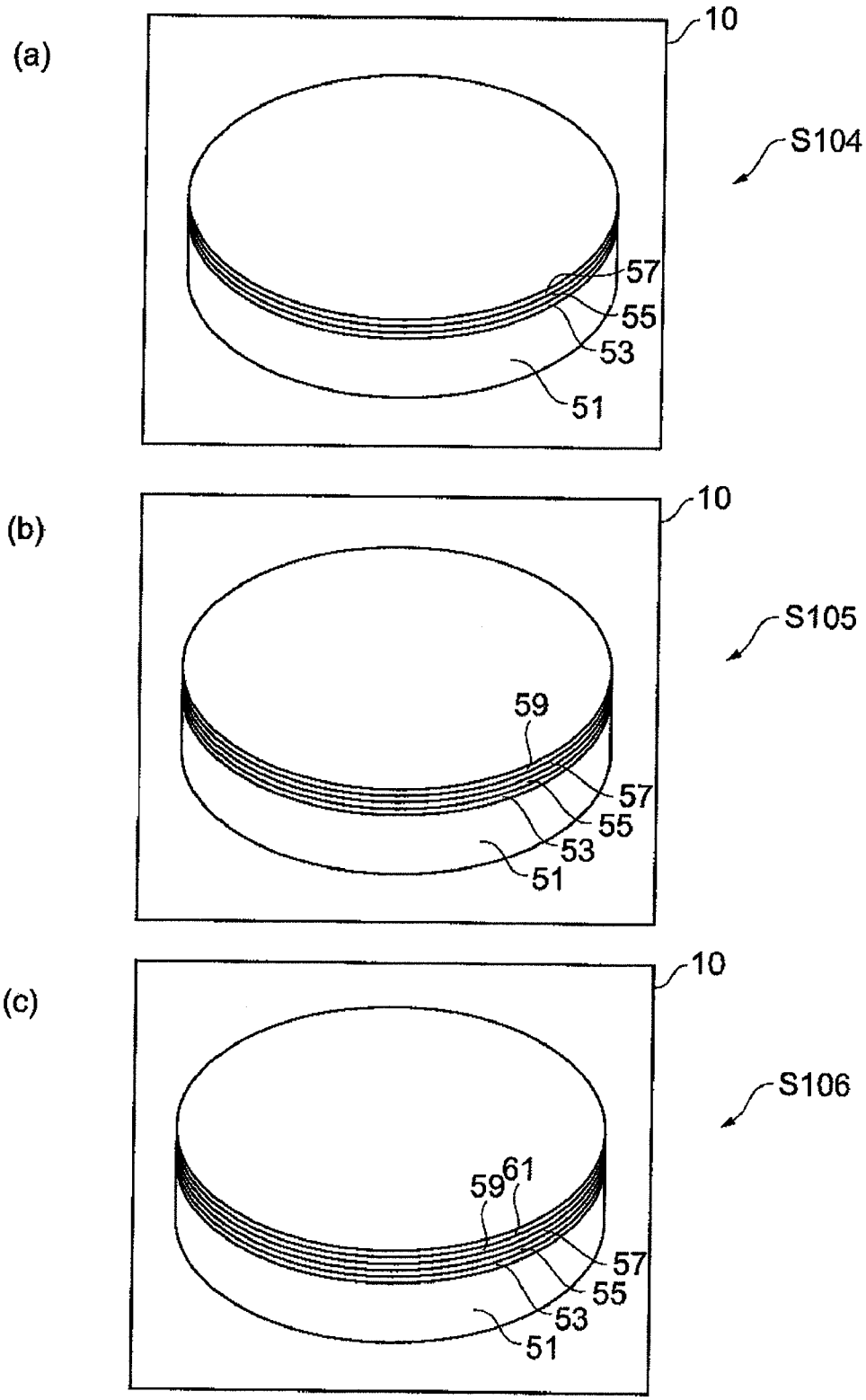
FIG. 6 is a drawing schematically showing major steps in the method for fabricating the III-nitride semiconductor optical device and epitaxial substrate.

Next, as shown in part (a) of FIG. 6, the growth of an active layer 57 carried out in step S104. At the substrate temperature of 870 Celsius degrees TMG and ammonia are supplied to the growth reactor to grow a gallium nitride based semiconductor barrier layer at this substrate temperature. The barrier layer is made of, for example, undoped GaN and the thickness thereof is 15 nm. After the growth of the barrier layer, the growth is interrupted and the substrate temperature is changed from 870 Celsius degrees to 830 Celsius degrees. At the substrate temperature T2 after the temperature has been changed, TMG, TMI and ammonia are supplied to the growth reactor to grow an undoped InGaN well layer. The thickness thereof is 3 nm. After the growth of the well layer, the supply of TMI is stopped and, while supplying TMG and ammonia to the growth reactor, the substrate temperature is changed from 830 Celsius degrees to 870 Celsius degrees. During this temperature change, a part of an undoped GaN barrier layer is being grown. After completion of the temperature change, the rest of the undoped GaN barrier layer is grown to complete the GaN barrier. The thickness of the GaN barrier layer is 15 nm. Subsequently, the substrate temperature change of the barrier layer and the growth of the well layer are repeatedly carried out to form InGaN well layers and GaN barrier layers. The barrier layers can be comprised of InGaN if necessary.

An optical guide layer is then grown on the active layer 57. For the optical guide layer, first, in step S105, as shown in part (b) of FIG. 6, TMG, TMI and ammonia are supplied to the growth reactor 10 to grow an undoped InGaN layer 59 on the active layer 57 at the substrate temperature of 840 Celsius degrees. The In composition of the grown layer is 0.02. After the growth of the InGaN layer 59 of the optical guide layer, step S106 is carried out as the next step in the present example to stop the supply of TMG and TMI and raise the substrate temperature to 1100 Celsius degrees. At this temperature, TMG, TMA, ammonia and bis(cyclopentadienyl) magnesium are supplied to the growth reactor 10 to grow an electron block layer 61, as shown in part (c) of FIG. 6. The electron block layer 61 is made of, for example, AlGaN. The Al composition of the electron block layer 61 is 0.12. The substrate temperature is decreased to 840 Celsius degrees, and at the substrate temperature of 840 Celsius degrees, TMG, TMI, ammonia and bis(cyclopentadienyl) magnesium are supplied to the growth reactor to grow a p-type GaN layer 63 of an optical guide layer on the electron block layer 61 in step S107, as shown in part (a) of FIG. 7. The substrate temperature is, for example, 1000 Celsius degrees. The growth of this p-type GaN layer 63 can adopt a film-forming condition that allows the carbon incorporation to increase, for example, when compared with the growth of the n-type GaN layer 55a. Furthermore, the growth of the electron block layer 61 can also adopt a film-forming condition that allows the carbon incorporation to increase, for example, when compared with the growth of the n-type GaN layer 55a. The carbon concentration of the electron block layer 61 is preferably smaller than that of a p-type cladding layer which will be grown in the later step. The thickness of the undoped InGaN layer 59 is, for example, 65 nm, the thickness of the Mg- and C-doped electron block layer 61 is, for example, 20 nm, and the thickness of the Mg- and C-doped GaN layer 63 is, for example, 200 nm.

Next, a gallium nitride based semiconductor region is grown on the optical guide layer 63. After the growth of the optical guide layer 63, the supply of TMG is stopped and a gas containing TMG, TMA, TMI, ammonia, and bis(cyclopentadienyl) magnesium is supplied to the growth reactor to grow a p-type cladding layer 65 in step S108. The substrate temperature of the p-type cladding layer 65 is, for example, 900 Celsius degrees and the thickness thereof, for example, 400 nm. The p-type cladding layer 65 is, for example, Mg- and C-doped InAlGaN, the Al composition thereof is, for example, 0.14, and the In composition thereof is 0.03. The growth of the p-type cladding layer 65 can adopt a film-forming condition that allows the carbon incorporation to increase, for example, when compared with the growth of the n-type cladding layer 53.

Thereafter, the supply of TMA is stopped and step S109 is carried out to grow a p-type contact layer 67. The p-type contact layer 67 is made, for example, of Mg- and C-doped GaN, InGaN, or the like, and the thickness thereof is, for example, 50 nm. The growth of this p-type contact layer 67 can adopt a film-forming condition that allows the carbon incorporation to increase, for example, when compared with the growth of the n-type GaN layer 55a. After the film formation, the temperature of the growth reactor is decreased to room temperature to produce an epitaxial substrate EP.

An electrode forming step is carried out to form electrodes on the epitaxial substrate EP as follows. First, an insulating film 69 (shown in FIG. 8), such as a silicon oxide film, is formed and, the silicon oxide film has a contact window formed by photolithography and etching. The contact window 69a has, for example, of a stripe shape, and the width thereof is, for example, 10 micrometers. Next, a p-side electrode (Ni/Au) 71a is formed on the p-type GaN contact layer 67. Thereafter, a p-pad electrode (Ti/Au) is formed thereon. If needed, the back surface of the GaN substrate 51 is polished to a desired thickness and thereafter an n-side electrode (Ti/Al) 71b is formed on this back surface of the epitaxial substrate EP. An annealing step can be carried out to anneal the electrodes (e.g., at 550 Celsius degrees) to produce a substrate product.

EXAMPLE 1

In the formation of an epitaxial substrate EP of this example, a high V/III ratio is used in growth of the p-type gallium nitride based semiconductor to increase the carbon concentration thereof. On the other hand, separately from this epitaxial substrate EP, another epitaxial substrate is produced, and in the formation of the other epitaxial substrate, a low V/III ratio is used in growth of the p-type gallium nitride based semiconductor. The carbon concentration of the p-type cladding layer of this other epitaxial substrate is smaller than that of the p-type cladding layer of the epitaxial substrate EP.

A semiconductor laser shown in FIG. 8 is fabricated as described below. A GaN slice is cut out at the angle of 75 degrees from a GaN ingot, which is grown in the (0001) direction, to prepare a GaN substrate having a {20-21} plane. The following semiconductor layers are epitaxially grown on the primary surface ({20-21} plane) of the GaN semiconductor region of this GaN substrate.

GaN substrate with 75 degree off-axis
N-type cladding layer: Si-doped InAlGaN, substrate temperature of 900 Celsius degrees, thickness 2 μm, Al composition 0.14, In composition 0.03;
Optical guide layer: undoped GaN, substrate temperature of 840 Celsius degrees, thickness 250 nm;
Optical guide layer: undoped InGaN, substrate temperature of 840 Celsius degrees, thickness 100 nm, In composition 0.02;
Active layer;
Barrier layers: undoped GaN, substrate temperature of 730 Celsius degrees, thickness 15 nm;
Well layers: undoped InGaN, substrate temperature of 730 Celsius degrees, thickness 3 nm, In composition 0.30;
Optical guide layer: undoped InGaN, substrate temperature of 840 Celsius degrees, thickness 50 nm, In composition 0.03;
Optical guide layer: undoped GaN, substrate temperature of 840 Celsius degrees, thickness 250 nm;
Electron block layer: Mg-doped AlGaN, substrate temperature of 1000 Celsius degrees, thickness 20 nm, Al composition 0.12;
P-type cladding layer: Mg-doped InAlGaN, substrate temperature of 900 Celsius degrees, thickness 400 nm, Al composition 0.14, In composition 0.03;
P-type contact layer: Mg-doped GaN, substrate temperature of 900 Celsius degrees, thickness 50 nm.

Figure 9:
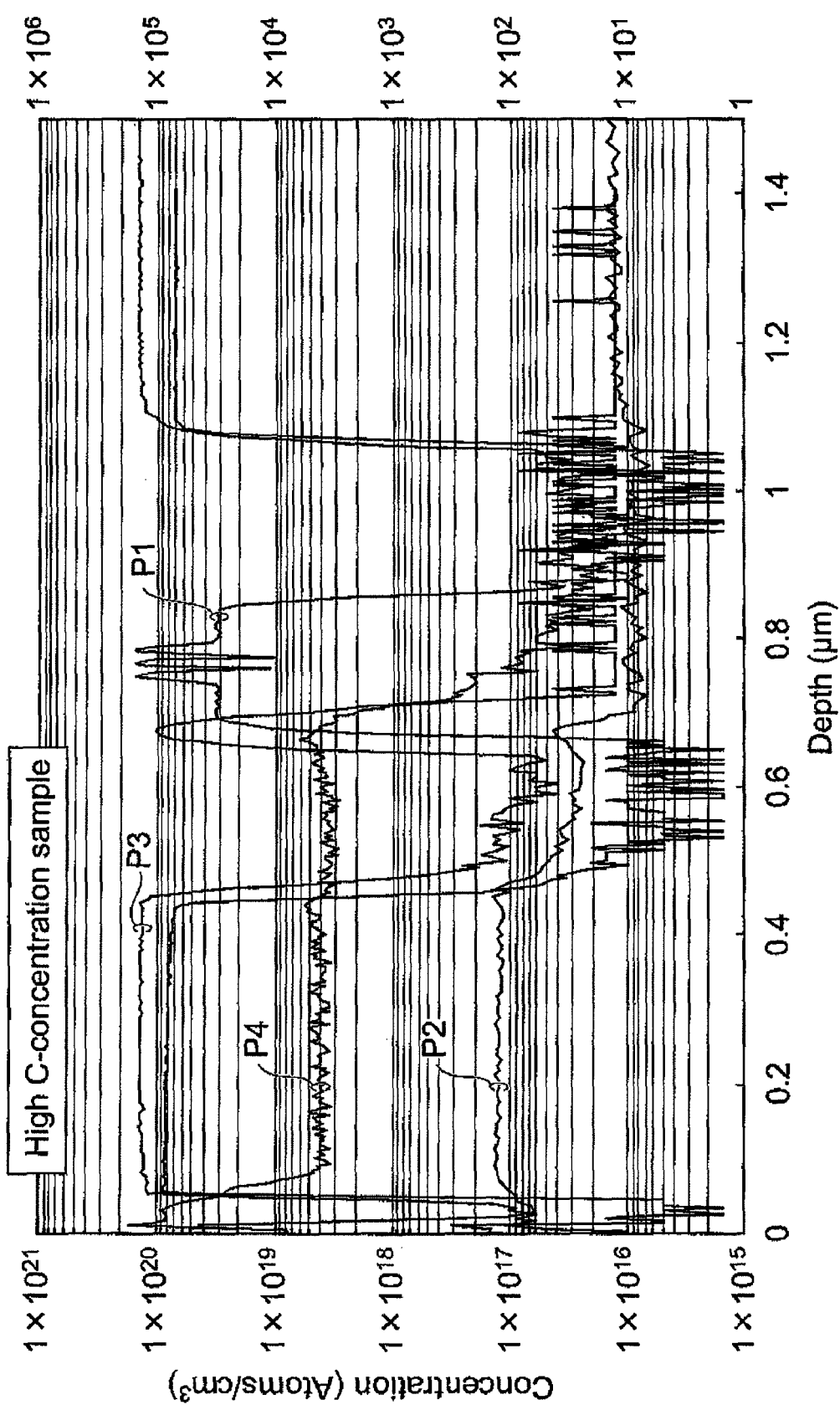
FIG. 9 is a drawing showing SIMS profiles of elements of indium, carbon, aluminum, and magnesium in an epitaxial substrate EP.
Figure 10:
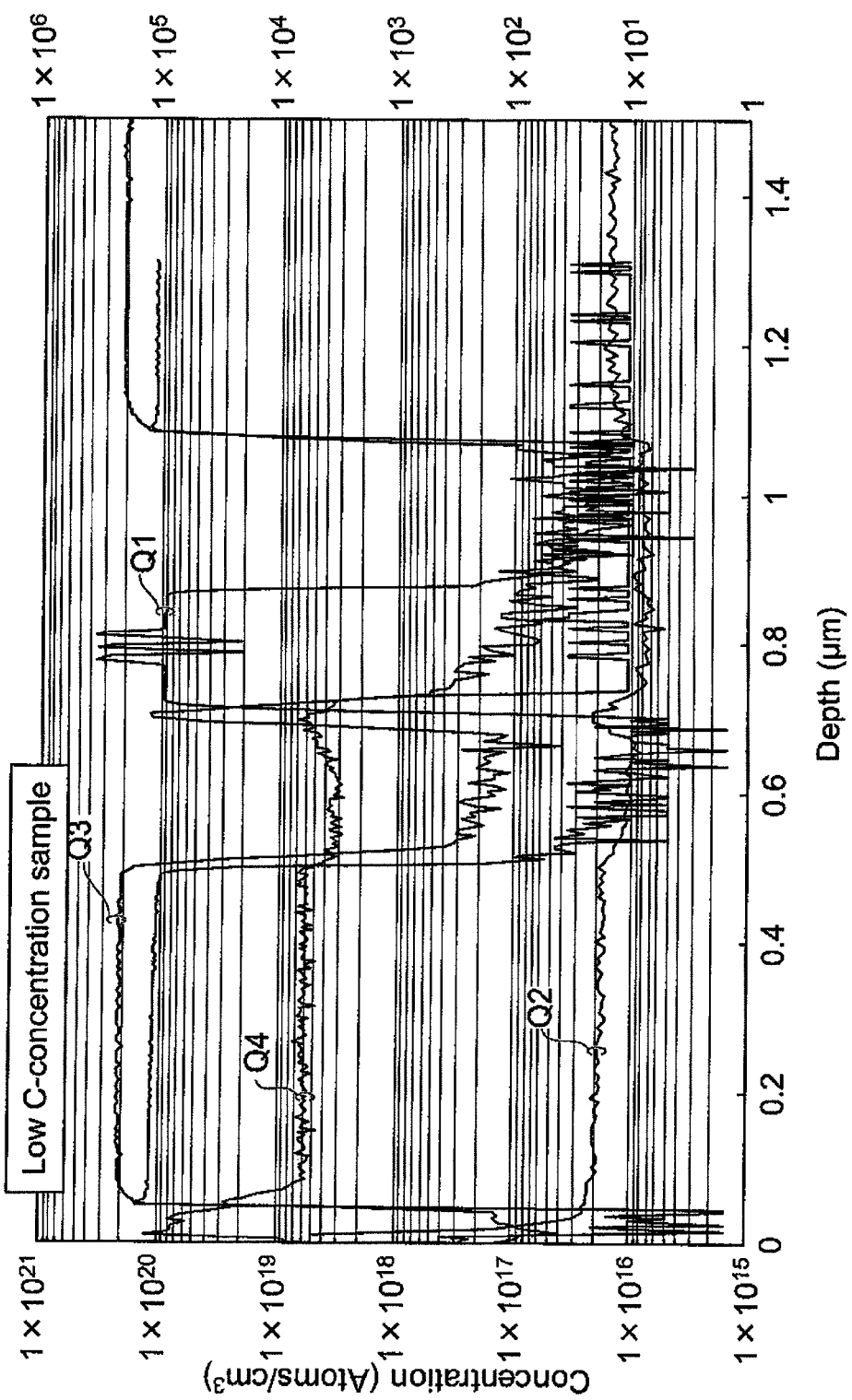
FIG. 10 is a drawing showing SIMS profiles of elements of indium, carbon, aluminum, and magnesium in another epitaxial substrate.

FIG. 9 is a drawing showing SIMS profiles of elements of indium, carbon, aluminum, and magnesium in the epitaxial substrate EP. FIG. 10 is a drawing showing SIMS profiles of elements of indium, carbon, aluminum, and magnesium in the other epitaxial substrate. FIGS. 9 and 10 show the profiles P1-P4 and Q1-Q4 measured by secondary ion mass spectrometry. The SIMS measurements are carried out using a magnetic sector type SIMS system.
P1, Q1: indium profiles;
P2, Q2: carbon profiles;
P3, Q3: aluminum profiles;
P4, Q4: magnesium profiles.

The SIMS profiles show the carbon concentrations determined by secondary ion mass spectrometry as follows. The carbon concentration of the p-type InAlGaN layer of the epitaxial substrate EP is $1 \times 10^{17}$ cm$^{-3}$, and the magnesium concentration of the p-type InAlGaN layer is $4 \times 10^{18}$ cm$^{-3}$. The carbon concentration of the p-type InAlGaN layer of the other epitaxial substrate was $1 \times 10^{16}$ cm$^{-3}$ and the magnesium concentration of the p-type InAlGaN layer was $6 \times 10^{18}$ cm$^{-3}$.

EXAMPLE 2

Laser diodes (LDs) are fabricated using the epitaxial substrate (high carbon concentration) EP and the other epitaxial substrate (low carbon concentration). A SiO$_2$ insulating film is grown on each of the surfaces of these epitaxial substrates, and thereafter a stripe window with the width of 10 μm is formed in this insulating film by wet etching. A p-side electrode of Ni/Au and a pad electrode of Ti/Al are evaporated thereon. The back surface of each epitaxial substrate is polished to the thickness of 100 μm. An n-side electrode of Ti/Al/Ti/Au is evaporated on the polished back surface. Laser bars are made from substrate products formed as described above. Each individual laser bar includes mirrors for an optical cavity. The end faces of each laser bar are coated with a dielectric multilayer film by vacuum evaporation. The dielectric multilayer film is composed of an alternate stack of SiO$_2$ and TiO$_2$. Each of film thicknesses is adjusted in a range of 50 to 100 nm so that the center wavelength of reflectance is designed to fall within the range of 500 to 530 nm. The multilayer film on one reflecting surface has an alternation array with ten cycles, and the designed value of reflectance is about 95%; the multilayer film on the other reflecting surface has an alternation array with six cycles, and the designed value of reflectance is about 80%. Next, evaluation by energization is carried out at room temperature. A pulsed power supply is used as a power supply with the pulse width of 500 ns and the duty ratio of 0.1%, and a needle is dropped onto the surface electrode to energize the device. On the occasion of measurement of optical output, emission from the laser bar end face is detected with a photodiode, an optical output-current characteristic (L-I characteristic) is investigated to determine a threshold current density. For measuring the emission wavelength, the emission from the laser bar end face is made to pass through an optical fiber, the spectrum is measured with a spectrum analyzer as a detector, to determine the oscillation wavelength. The voltage-current characteristic (V-I characteristic) is measured by the four probe method. The below provides an average of ten LDs with good characteristics in each wafer.

Sample name, Threshold, Threshold Oscillation Device voltage, wavelength, resistance
High C-concentration LD: 5 kA/cm$^2$, 5.2 V, 521 nm, 2Ω;
Low C-concentration LD: 15 kA/cm$^2$, 7.2 V, 520 nm, 6Ω.
In the high C-concentration LD, the carbon concentration is not less than $2\times10^{16}$ cm$^{-3}$ throughout the entire p-type semiconductor region. On the other hand, in the low C-concentration LD, the carbon concentration is less than $2\times10^{16}$ cm$^{-3}$ throughout the entire p-type semiconductor region.

These results reveal that when carbon in the predetermined concentration range is incorporated in the semipolar or nonpolar p-type gallium nitride based semiconductor, the electrical characteristics of the p-type semiconductor layer are improved, resulting in improving the device characteristics.

The below will describe influence of dislocation density of GaN substrate on the p-type carbon dopant. In heteroepitaxial growth of GaN on a semipolar plane on a Si substrate, a sapphire substrate, a SiC substrate, and so on, the crystal quality of the epitaxial films thereon is not so high at present. Specifically, in films heteroepitaxially grown using the foregoing heterogeneous substrates, the threading dislocations density thereof are not less than $1\times10^7$ cm$^{-2}$. In light emitting devices with an InGaN active layer to emit light at the emission wavelength of violet or blue, since the diffusion length of carriers is small, e.g., not more than 0.2 μm, high-efficiency emission is observed even in the InGaN active layer with a high dislocation density. In the InGaN active layer to emit green light, however, the diffusion length of carriers becomes not less than 0.2 μm, and the dislocation density of the InGaN active layer constituting this active layer needs to be not more than $1\times10^7$ cm$^{-2}$. When the light emitting device is a laser diode, much higher quality is required as to the dislocation density and the value thereof is desirably not more than $1\times10^6$ cm$^{-2}$. In order to make the stripe of the laser diode that contain no dislocation at all, the dislocation density needs to be not more than $1\times10^5$ cm$^{-2}$.

Furthermore, when dislocations are present in the epitaxial semiconductor region, the surface morphology locally varies during growth. Specifically, pits are formed around the dislocations. For this reason, an incorporation amount of impurity near a dislocation becomes locally different from that in a surrounding region around the dislocation because of influence of the pit, when compared with a semiconductor region in which no dislocation exists in the epitaxial semiconductor region and the semipolar GaN surface is uniformly grown. For this reason, a semiconductor layer with a uniform impurity distribution can be grown though a low dislocation density is desired. Specifically, if the dislocation density is the threading dislocation density of not more than $1\times10^7$ cm$^{-2}$, the influence of local impurity distribution can be reduced. For this reason, it is preferable that the gallium nitride based semiconductor substrate have a value of not more than the aforementioned dislocation density.

The {20-21} plane used in the examples is different from the nitrogen planes used in the prior art technologies, and the GaN-based semiconductor growth mechanism on the {20-21} plane in the present case is considered to be different from the GaN-based semiconductor growth mechanism on the plane of plane orientation {10-11}.

Figure 11:
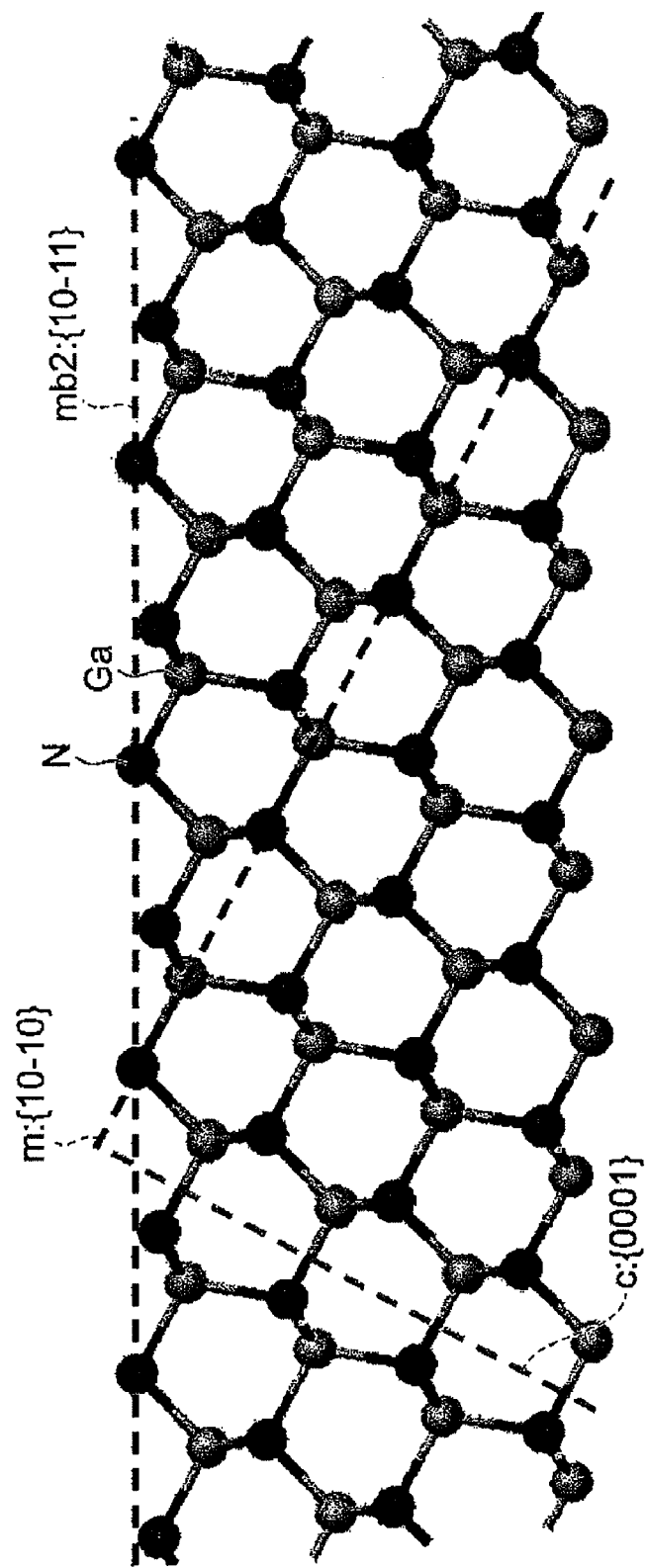
FIG. 11 is a drawing schematically showing an atomic arrangement in a {10-11} plane.
Figure 12:
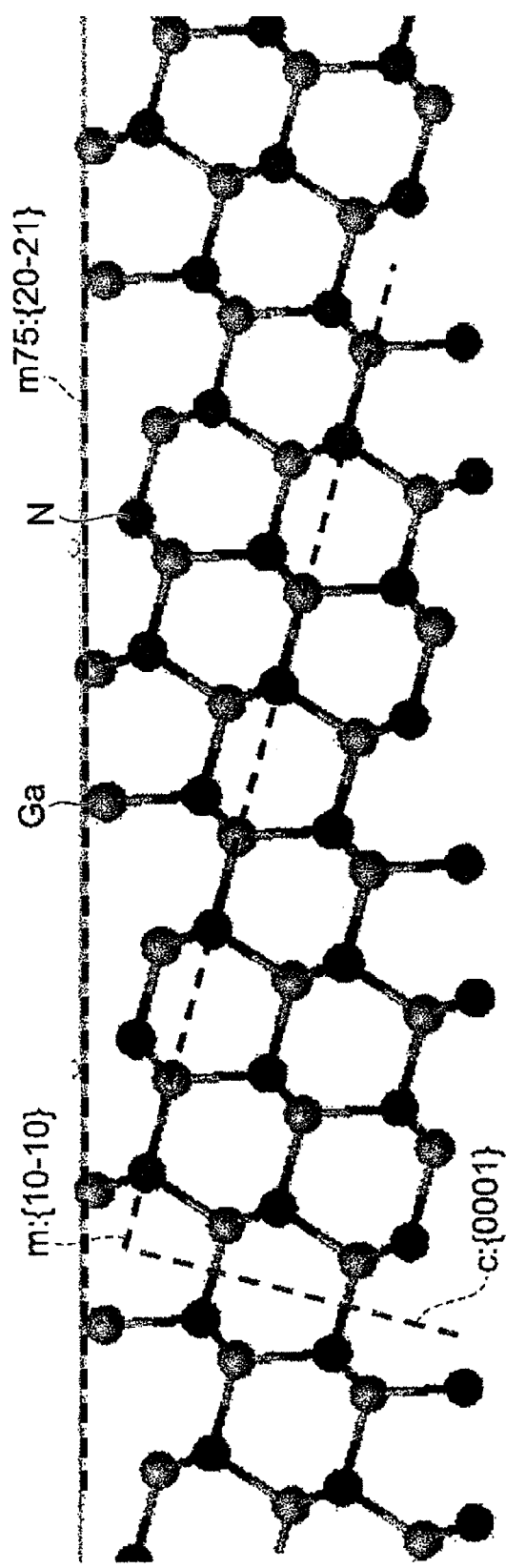
FIG. 12 is a drawing schematically showing an atomic arrangement in a {20-21} plane.
Figure 13:
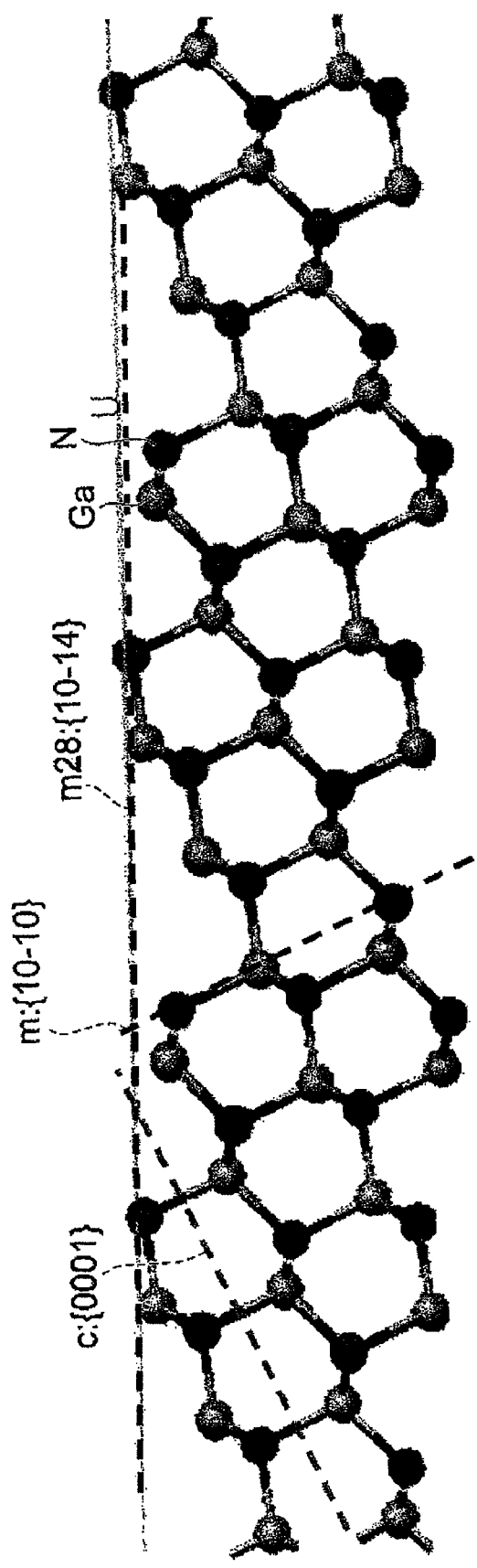
FIG. 13 is a drawing schematically showing an atomic arrangement in a {1014} plane.

Non Patent Literature describes that the ground that carbon behaves as an acceptor in {10-11}-plane GaN is as follows: (1-101) is a nitrogen terminal plane. FIG. 11 is a drawing schematically showing an atomic arrangement in this semipolar {10-11} plane. FIG. 12 is a drawing schematically showing an atomic arrangement in a semipolar {20-21} plane. FIG. 13 is a drawing schematically showing an atomic arrangement in a {10-14} plane which is also a semipolar plane. As shown in FIG. 12, the atomic arrangement of the {20-21} plane is not a perfect nitrogen-terminal plane.

{10-11} plane: nitrogen terminal plane because all atoms in the outermost surface are nitrogen.
{20-21} plane: not a nitrogen terminal plane because two thirds of atoms in the outermost surface are Ga atoms.
{10-14} plane: not a nitrogen terminal plane because three fifths of atoms in the outermost surface are Ga atoms.

As shown in FIG. 12, the {20-21} plane is not a nitrogen terminal plane and, according to Inventors' experiments, carbon behaves as a shallow acceptor in GaN associated with the {20-21} plane and {10-10} plane. This shows that the technical contribution of the shallow carbon acceptor in the present embodiment is not due to the nitrogen terminal plane.

For comparison, with reference to the atomic arrangement of the {10-14} plane, the ratio of Ga/N in the {10-14} plane is close to the ratio of Ga/N in {20-21}. However, carbon does not work as a shallow acceptor in an angle range near the {10-14} plane.

According to Inventors' investigation, the difference between the {20-21} plane and the {10-14} plane is considered to be caused by the difference in orientations of bonds in the outermost surface appearing in the incorporation of carbon. In the {10-14} plane, there appear steps slightly inclined from the c-plane {0001} toward the {10-11} plane. In contrast to it, in the {20-21} plane there appear steps slightly inclined from the {10-11} plane toward the {10-10} plane. Because of the difference between properties of these steps, it becomes feasible to efficiently and preferentially incorporate carbon by linkage between carbon and bonds in the outermost surface, and incorporated carbon forms a shallow acceptor. Therefore, the technical advantage of the present embodiment can be enjoyed in the plane orientation and inclination angle range capable of providing the same or similar steps as the steps in the {20-21} plane.

In the p-type gallium nitride based semiconductor in the present embodiment, the lower limit of carbon concentration is preferably not less than $2\times10^{16}$ cm$^{-3}$, and the upper limit thereof is preferably not more than $1\times10^{19}$ cm$^{-3}$. In the undoped gallium nitride based semiconductor in the present embodiment, the upper limit of carbon concentration is preferably not more than $1\times10^{17}$ cm$^{-3}$. In the n-type gallium nitride based semiconductor in the present embodiment, the lower limit of carbon concentration is preferably not less than $2\times10^{16}$ cm$^{-3}$ and the upper limit thereof is preferably not more than $1\times10^{18}$ cm$^{-3}$.

As described above, the embodiment provides the III-nitride semiconductor optical device including the p-type gallium nitride based semiconductor layer with reduced resistance. Furthermore, the embodiment provides the epitaxial substrate for this III-nitride semiconductor optical device.

Having illustrated and described the principle of the present invention in the preferred embodiments, but it is recognized by those skilled in the art that the present invention can be modified in arrangement and detail without departing from the principle. The present invention is by no means limited to the specific configurations disclosed in the embodiments. Therefore, we claim all modifications and changes falling within the scope of claims and resulting from the scope of spirit thereof.

What is claimed is:

1. A III-nitride semiconductor optical device comprising:
   a support base comprised of a III-nitride semiconductor and having a primary surface at an angle with respect to a reference plane perpendicular to a reference axis, the reference axis extending in a c-axis direction of the III-nitride semiconductor;
   an n-type gallium nitride based semiconductor layer provided on the primary surface of the support base;
   a p-type gallium nitride based semiconductor layer provided on the primary surface of the support base and doped with magnesium; and
   an active layer provided between the n-type gallium nitride based semiconductor layer and the p-type gallium nitride based semiconductor layer on the primary surface of the support base,
   the angle being in the range of not less than 40 degree and not more than 140 degree,
   the primary surface having either one of semipolar nature and nonpolar nature,
   the p-type gallium nitride based semiconductor layer containing carbon as a p-type dopant,
   a carbon concentration of the p-type gallium nitride based semiconductor layer being not less than $2\times10^{16}$ cm$^{-3}$, and
   the carbon concentration of the p-type gallium nitride based semiconductor layer being not more than $1\times10^{19}$ cm$^{-3}$.

2. The III-nitride semiconductor optical device according to claim 1,
   wherein the active layer includes well layers and barrier layers alternately arranged in a direction of a normal axis to the primary surface of the support base,
   wherein the barrier layers are comprised of a gallium nitride based semiconductor,
   wherein a thickness of the barrier layer is larger than a thickness of the well layer,
   wherein the well layers are comprised of a gallium nitride based semiconductor containing indium as a constituent element, and
   wherein a carbon concentration of the well layers is not more than $1\times10^{17}$ cm$^{-3}$.

3. The III-nitride semiconductor optical device according to claim 1,
   wherein a carbon concentration of the n-type gallium nitride-based semiconductor layer is smaller than the carbon concentration of the p-type gallium nitride based semiconductor layer,
   wherein the n-type gallium nitride based semiconductor layer contains an n-type dopant, and
   wherein a concentration of the n-type dopant in the n-type gallium nitride based semiconductor layer is larger than the carbon concentration of the n-type gallium nitride based semiconductor layer.

4. The III-nitride semiconductor optical device according to claim 1,
   wherein a carbon concentration of the n-type gallium nitride based semiconductor layer is not more than $1\times10^{18}$ cm$^{-3}$.

5. The III-nitride semiconductor optical device according to claim 1,
   wherein the n-type gallium nitride based semiconductor layer is comprised of one of InAlGaN and AlGaN.

6. The III-nitride semiconductor optical device according to claim 1,
   wherein the carbon concentration in the p-type gallium nitride based semiconductor layer is larger than a magnesium concentration in the p-type gallium nitride based semiconductor layer.

7. The III-nitride semiconductor optical device according to claim 1, further comprising:
   a first optical guide layer provided between the p-type gallium nitride gallium nitride based semiconductor layer and the active layer, the first optical guide layer being comprised of a gallium nitride based semiconductor; and
   a second optical guide layer provided between the n-type gallium nitride based semiconductor layer and the active layer, the second optical guide layer being comprised of a gallium nitride based semiconductor,
   wherein at least a part of the first optical guide layer contains magnesium as a p-type dopant,
   wherein a carbon concentration of the first optical guide layer is not more than $1\times10^{17}$ cm$^{-3}$,
   wherein a magnesium concentration in the first optical guide layer is not more than $1\times10^{17}$ cm$^{-3}$, and
   wherein a carbon concentration of the second optical guide layer is not more than $1\times10^{17}$ cm$^{-3}$.

8. The III-nitride semiconductor optical device according to claim 7,
   wherein the active layer includes a quantum well structure adapted to generate light at a wavelength of not less than 430 nm and not more than 600 nm,
   the III-nitride semiconductor optical device further comprising an electron block layer, the electron block layer being provided between the active layer and the p-type gallium nitride based semiconductor layer,
   wherein the first optical guide layer includes a first InGaN layer provided between the electron block layer and the active layer, and
   wherein the second optical guide layer includes a second InGaN layer provided between the active layer and the n-type gallium nitride based semiconductor layer.

9. The III-nitride semiconductor optical device according to claim 1,
   wherein the n-type gallium nitride based semiconductor layer, the active layer, and the p-type gallium nitride based semiconductor layer are arranged in a direction of a normal to the primary surface of the support base,
   wherein the p-type gallium nitride based semiconductor layer is provided on a primary surface of the active layer,
   wherein the primary surface of the active layer is in the range of not less than 40 degrees and not more than 140 degrees with respect to the reference plane, and
   wherein the active layer is provided on a primary surface of the n-type gallium nitride based semiconductor layer.

10. The III-nitride semiconductor optical device according to claim 1, further comprising:
  a contact layer provided on a primary surface of the p-type gallium nitride based semiconductor layer, the contact layer being comprised of a p-type gallium nitride based semiconductor; and
  a first electrode in contact with the contact layer,
  wherein the contact layer contains magnesium as a p-type dopant,
  wherein a carbon concentration of the contact layer is not less than $2 \times 10^{16}$ cm$^{-3}$, and
  wherein the carbon concentration of the contact layer is not more than $1 \times 10^{19}$ cm$^{-3}$.

11. The III-nitride semiconductor optical device according to claim 1,
  wherein the reference axis extending in the c-axis direction is inclined in a direction which is in a range of not less than −15 degrees and not more than +15 degrees with respect to a <11-20> direction of the III-nitride semiconductor of the support base, and
  wherein the angle between the primary surface of the support base and the reference plane perpendicular to the reference axis extending in the c-axis direction is in the range of not less than 59 degrees and not more than 121 degrees.

12. The III-nitride semiconductor optical device according to claim 1,
  wherein the reference axis extending in the c-axis direction is inclined in a direction which is in a range of not less than −15 degrees and not more than +15 degrees with respect to a <1-100> direction of the III-nitride semiconductor of the support base, and
  wherein the angle between the primary surface of the support base and the reference plane perpendicular to the reference axis extending in the c-axis direction is in the range of not less than 63 degrees and not more than 117 degrees.

13. The III-nitride semiconductor optical device according to claim 1,
  wherein the primary surface of the support base is in the range of −4 degrees to +4 degrees with respect to any one plane of {11-22}, {11-21}, {11-20}, {11-2-1}, and {11-2-2}.

14. The III-nitride semiconductor optical device according to claim 1,
  wherein a plane index of the primary surface of the support base is any one of {11-22}, {11-21}, {11-20}, {11-2-1}, and {11-2-2}.

15. The III-nitride semiconductor optical device according to claim 1,
  wherein the primary surface of the support base is in the range of −4 degrees to +4 degrees with respect to any one plane of {10-11}, {20-21}, {10-10}, {20-2-1}, and {10-1-1}.

16. The III-nitride semiconductor optical device according to claim 1,
  wherein a plane index of the primary surface of the support base is any one of {10-11}, {20-21}, {10-10}, {20-2-1}, and {10-1-1}.

17. The III-nitride semiconductor optical device according to claim 1,
  wherein a threading dislocation density of the support base is not more than $1 \times 10^7$ cm$^{-2}$, and
  wherein the support base is comprised of any one of GaN, InGaN, AlGaN, and InAlGaN.

18. The III-nitride semiconductor optical device according to claim 1, further comprising:
  a second electrode in contact with a back surface of the support base,
  wherein the support base has electrical conductivity.

19. The III-nitride semiconductor optical device according to claim 1,
  wherein the p-type gallium nitride based semiconductor layer is comprised of at least either of InAlGaN and AlGaN.

20. The III-nitride semiconductor optical device according to claim 1,
  wherein the p-type gallium nitride based semiconductor layer is comprised of InAlGaN.

21. An epitaxial substrate for a III-nitride semiconductor optical device, comprising:
  a III-nitride semiconductor substrate comprised of a III-nitride semiconductor and having a primary surface at an angle with respect to a reference plane perpendicular to a reference axis, the reference axis extending in a c-axis direction of the III-nitride semiconductor;
  an n-type gallium nitride based semiconductor layer provided on the primary surface of the III-nitride semiconductor substrate;
  a p-type gallium nitride based semiconductor layer provided on the primary surface of the III-nitride semiconductor substrate and doped with magnesium; and
  an active layer provided between the n-type gallium nitride based semiconductor layer and the p-type gallium nitride based semiconductor layer on the primary surface of the III-nitride semiconductor substrate,
  the angle being in the range of not less than 40 degrees and not more than 140 degrees,
  the primary surface having either one of semipolar nature and nonpolar nature,
  the p-type gallium nitride based semiconductor layer containing carbon as a p-type dopant,
  a carbon concentration of the p-type gallium nitride based semiconductor layer being not less than $2 \times 10^{16}$ cm$^{-3}$, and
  the carbon concentration of the p-type gallium nitride based semiconductor layer being not more than $1 \times 10^{19}$ cm$^{-3}$.

22. The epitaxial substrate according to claim 21,
  wherein the active layer includes well layers and barrier layers alternately arranged in a direction of a normal axis to the primary surface of the III-nitride semiconductor substrate,
  wherein the barrier layers are comprised of a gallium nitride based semiconductor,
  wherein a thickness of the barrier layer is larger than a thickness of the well layer,
  wherein the well layers are comprised of a gallium nitride gallium nitride based semiconductor, and the gallium nitride gallium nitride based semiconductor contains indium as a constituent element,
  wherein a carbon concentration of the well layers is not more than $1 \times 10^{17}$ cm$^{-3}$,
  wherein a carbon concentration of the n-type gallium nitride based semiconductor layer is smaller than the carbon concentration of the p-type gallium nitride based semiconductor layer,
  wherein the n-type gallium nitride based semiconductor layer contains an n-type dopant, and
  wherein a concentration of the n-type dopant in the n-type gallium nitride based semiconductor layer is larger than the carbon concentration of the n-type gallium nitride based semiconductor layer.

* * * * *